United States Patent
Kang et al.

(10) Patent No.: US 7,834,391 B2
(45) Date of Patent: Nov. 16, 2010

(54) INTEGRATED CIRCUIT MEMORY DEVICES INCLUDING MEMORY CELLS ON ADJACENT PEDESTALS HAVING DIFFERENT HEIGHTS, AND METHODS OF FABRICATING SAME

(75) Inventors: Hee-Soo Kang, Gyeonggi-do (KR); Choong-Ho Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 309 days.

(21) Appl. No.: 12/107,918

(22) Filed: Apr. 23, 2008

(65) Prior Publication Data
US 2009/0052251 A1    Feb. 26, 2009

(30) Foreign Application Priority Data
Aug. 23, 2007    (KR) .................. 10-2007-0084760

(51) Int. Cl.
*H01L 29/788* (2006.01)
*H01L 21/336* (2006.01)
(52) U.S. Cl. ............... 257/321; 257/316; 257/E29.129; 257/E29.3; 257/E21.179; 438/257
(58) Field of Classification Search ............ 257/316, 257/321, E29.129, E29.3, E21.179; 438/257
See application file for complete search history.

(56) References Cited

U.S. PATENT DOCUMENTS

| | | | |
|---|---|---|---|
| 5,610,419 | A | 3/1997 | Tanaka |
| 5,635,748 | A | 6/1997 | Nishizaka |
| 5,693,552 | A | 12/1997 | Hsu |
| 5,949,700 | A * | 9/1999 | Furukawa et al. ............. 365/51 |
| 6,713,811 | B2 * | 3/2004 | Hsieh ......................... 257/316 |
| 7,122,425 | B2 * | 10/2006 | Chance et al. .............. 438/253 |
| 2006/0228880 | A1 * | 10/2006 | McDaniel et al. ........... 438/625 |
| 2007/0278625 | A1 | 12/2007 | Masuoka et al. |
| 2009/0039418 | A1 * | 2/2009 | Min et al. ................... 257/327 |

OTHER PUBLICATIONS

Search Report under Section 17, GB Application No. GB0812997.5, Oct. 26, 2008.

* cited by examiner

*Primary Examiner*—Ngan Ngo
(74) *Attorney, Agent, or Firm*—Myers Bigel Sibley & Sajovec, P.A.

(57) ABSTRACT

Coupling among adjacent rows of memory cells on an integrated circuit substrate may reduced by forming the adjacent rows of memory cells on adjacent semiconductor pedestals that extend different distances away from the integrated circuit substrate. NAND flash memory devices that include different pedestal heights and fabrication methods for integrated circuit memory devices are also disclosed.

32 Claims, 21 Drawing Sheets

INTEGRATED CIRCUIT MEMORY DEVICES INCLUDING MEMORY CELLS ON ADJACENT PEDESTALS HAVING DIFFERENT HEIGHTS, AND METHODS OF FABRICATING SAME

CROSS-REFERENCE TO RELATED APPLICATION

This application claims the benefit under 35 USC §119 of Korean Patent Application No. 10-2007-0084760, filed on Aug. 23, 2007, the disclosure of which is hereby incorporated herein by reference in its entirety as if set forth fully herein.

FIELD OF THE INVENTION

This invention relates to integrated circuit devices and fabrication methods therefor, and more particularly to integrated circuit memory devices and fabrication methods therefor.

BACKGROUND OF THE INVENTION

Integrated circuit memory devices are widely used in many consumer, industrial and other applications. As is well known to those having skill in the art, integrated circuit memory devices generally include one or more large arrays of memory cells that are generally arranged in rows and columns. As the integration density of integrated circuit memory devices continues to increase, adjacent rows and/or columns may be squeezed closer together. This squeezing together may cause interference among adjacent memory cells due to various undesired couplings therebetween.

SUMMARY OF THE INVENTION

Some embodiments of the invention provide integrated circuit memory devices that comprise an integrated circuit substrate and a plurality of semiconductor pedestals extending away from the substrate. The semiconductor pedestals have semiconductor tops remote from the substrate. At least two adjacent semiconductor pedestals have different heights, such that the semiconductor tops of the at least two adjacent semiconductor pedestals are different distances away from the substrate. A respective memory cell is provided on a respective one of the at least two adjacent semiconductor pedestals having different heights. By providing the adjacent memory cells on semiconductor pedestals having different heights, coupling therebetween can be reduced, notwithstanding a high integration density of the integrated circuit memory device.

In some embodiments, the plurality of semiconductor pedestals comprises first and second interleaved arrays of semiconductor pedestals extending away from the substrate. The semiconductor pedestals have semiconductor tops remote from the substrate. The first array has a first height and the second array has a second height that is different from the first height.

Moreover, in some embodiments, the memory cells comprise NAND memory cells. In some embodiments, the NAND memory cells include a floating gate therein, and the different heights are sufficiently different such that a bottom of at least one floating gate is further away from the substrate than the top of at least one floating gate.

Also, in some embodiments, the plurality of pedestals define a plurality of trenches therebetween, and an isolation layer is provided in the plurality of trenches. In some embodiments, the isolation layer between at least three adjacent semiconductor pedestals extends a same distance away from the substrate.

NAND flash memory devices according to various embodiments of the present invention include a plurality of alternating odd and even bit lines and a plurality of odd and even strings of flash memory cells, a respective odd and even string being serially connected to a respective odd and even bit line. A plurality of alternating odd and even semiconductor pedestals are also provided. A respective odd string of flash memory cells is on a respective odd semiconductor pedestal and a respective even string of flash memory cells is on a respective even semiconductor pedestal. The plurality of odd semiconductor pedestals are of different height than the plurality of even semiconductor pedestals.

In some embodiments, the flash memory cells are floating gate NAND flash memory cells that include a tunnel layer on the semiconductor pedestals, a floating gate on the tunnel layer, a dielectric layer on the floating gate and a control gate on the dielectric layer. In some embodiments, the dielectric layer extends along a top of the floating gate but does not extend along sidewalls thereof. In other embodiments, the dielectric layer extends along a top of a floating gate and further extends along sidewalls thereof. Moreover, in some embodiments, the different heights are sufficiently different such that bottoms of the floating gates in the odd strings are further away from the substrate than tops of the floating gates in the even strings. Moreover, in some embodiments, the dielectric layer may comprise silicon oxide, silicon nitride, aluminum oxide, hafnium oxide, other high dielectric constant materials, a stack of silicon oxide, silicon nitride, silicon oxide, a stack of silicon oxide, aluminum oxide, and silicon oxide, a stack of silicon oxide, hafnium oxide and silicon nitride, and/or a stack of silicon oxide, a dielectric constant material and silicon oxide.

In still other embodiments, the flash memory cells are charge trap NAND flash memory cells that include a tunnel layer on the semiconductor pedestals, a charge trap layer on the tunnel layer, a dielectric layer on the charge trap layer and a gate on a dielectric layer. In some embodiments, the dielectric layer extends along a top of the charge trap layer but does not extend along sidewalls thereof, whereas in other embodiments the dielectric layer extends along the top of the charge trap layer and further extends along sidewalls thereof. Moreover, in some embodiments, the different heights are sufficiently different such that a bottom of the charge trap layer in the odd strings is further away from the substrate than a top of the charge trap layer in the even strings. The dielectric layer may comprise one or more of the materials described above.

Any and all embodiments of the present invention may be combined with a host device that is configured to write information into the memory device and to read information from the memory device. The host device may comprise a memory controller, a microprocessor, a camera, a wireless terminal, a portable media player, a desktop computer, a notebook computer and/or a vehicle navigation system. Moreover, NOR flash memory cells and/or other types of memory cells may be used.

Integrated circuit memory devices may be fabricated, according to various embodiments of the present invention, by forming a plurality of semiconductor pedestals that extend away from an integrated circuit substrate, the semiconductor pedestals having semiconductor tops remote from the substrate. At least two adjacent semiconductor pedestals have different heights, such that the semiconductor tops of the at least two adjacent semiconductor pedestals are different distances away from the substrate. A respective memory cell is formed on a respective one of the at least two adjacent semiconductor pedestals having different heights.

In some embodiments, the semiconductor pedestals are fabricated by forming spaced apart precursor pedestals in the integrated circuit substrate, masking portions of the integrated circuit substrates between the precursor pedestals to expose the integrated circuit substrate between the precursor pedestals and the masked portions, and etching the integrated circuit substrate between the precursor pedestals and the masked portions to define the plurality of semiconductor pedestals. In some embodiments, an isolation layer is formed between the semiconductor pedestals.

In other embodiments, the semiconductor pedestals are fabricated by forming spaced apart precursor pedestals in the integrated circuit substrate, forming a conformal layer on the spaced apart precursor pedestals and on the integrated circuit substrate therebetween and forming a masking layer on a portion of the conformal layer that is on the integrated circuit substrate between the spaced apart precursor pedestals. The conformal layer is removed between the precursor pedestals and the masking layer to expose the integrated circuit substrate. The integrated circuit substrate that is exposed is then etched between the precursor pedestals and the masking layer, to define the plurality of semiconductor pedestals. An isolation layer may be formed between the semiconductor pedestals.

In some embodiments, the memory cells themselves may be fabricated by forming a tunnel layer on the semiconductor pedestals, forming a floating gate on the tunnel layer, forming a dielectric layer on the floating gate, and forming a control gate on the dielectric layer, to thereby form a floating gate flash memory device. The dielectric layer may be formed along a top of a floating gate, but not along sidewalls thereof, or may further extend along sidewalls thereof. The dielectric layer may comprise any of the materials that were described above.

In still other embodiments of the present invention, a respective memory cell may be fabricated by forming a tunnel layer on the semiconductor pedestals, forming a charge trap layer on the tunnel layer, forming a dielectric layer on the charge trap layer and a forming a gate on the dielectric layer, to thereby form a charge trap flash memory device. The dielectric layer may be formed along a top of the charge trap layer, but not extend along sidewalls thereof, or may also extend along sidewalls thereof. The dielectric layer may comprise any of the materials that were described above.

Still other embodiments of the present invention provide methods of reducing coupling, such as capacitive coupling, among adjacent rows of memory cells on an integrated circuit substrate. These methods comprise forming the adjacent rows of memory cells on adjacent semiconductor pedestals that extend different distances away from the integrated circuit substrate. In some embodiments, the adjacent rows of memory cells are formed on adjacent spaced apart semiconductor pedestals having tops that extend different distances away from the integrated circuit substrate. An isolation layer may also be formed between the semiconductor pedestals that extend different distances away from the integrated circuit substrate. In some embodiments, the isolation layer extends a same distance away from the integrated circuit substrate between at least three adjacent semiconductor pedestals.

Moreover, in some embodiments, the memory cells are NAND flash memory cells.

DETAILED DESCRIPTION

Figure 1A:
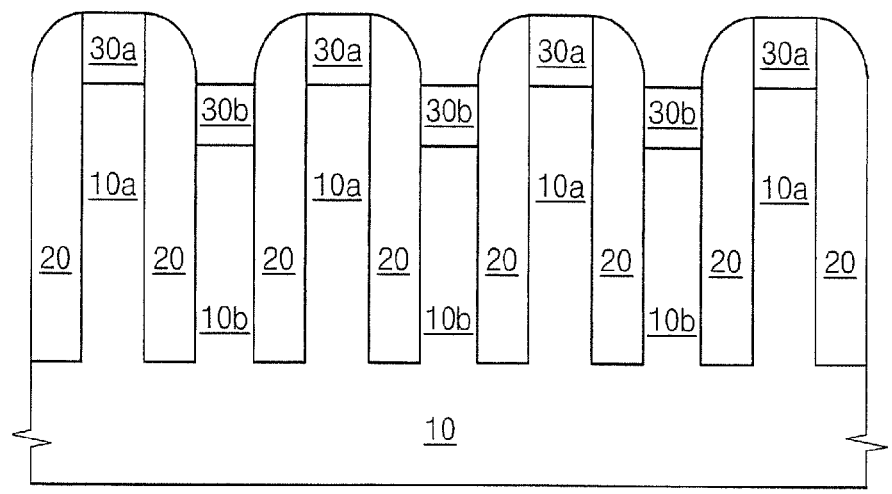
FIG. 1A is a cross-sectional view of an integrated circuit memory device according to various embodiments of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout. As used herein, the term "and/or" includes any and all combinations of one or more of the associated listed items.

It will be understood that, although the terms first, second, odd, even, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first or odd element, component, region, layer or section discussed below could be termed a second or even element, component, region, layer or section without departing from the teachings of the present invention.

Spatially relative terms, such as "beneath," "below," "lower," "above," "upper," "top," "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. It also will be understood that, as used herein, the terms "row" or "horizontal" and "column" or "vertical" indicate two relative non-parallel directions that may be orthogonal to one another. However, these terms also are intended to encompass different orientations.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes," "including" and variants thereof, when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A is a cross-sectional view of an integrated circuit memory device according to various embodiments of the present invention. As shown in FIG. 1A, this integrated circuit memory device includes an integrated circuit substrate 10. A plurality of semiconductor pedestals 10a, 10b extend away from the substrate 10. At least two adjacent semiconductor pedestals 10a, 10b have different heights, such that the semiconductor tops of the at least two adjacent semiconductor pedestals 10a, 10b are different distances away from the substrate. For example, as shown in FIG. 1A, the tops of the semiconductor pedestals 10a extend further away from the substrate 10 than the tops of the semiconductor pedestals 10b. As used herein, the term "top" refers to a surface that is furthest from the substrate 10. It will be understood that the substrate 10 may include a single element and/or compound bulk semiconductor substrate or may include one or more single element and/or compound semiconductor layers on another substrate using technology such as Semiconductor-On-Insulator (SOI) or other technology. The semiconductor pedestals 10a, 10b may be integral with the bulk semiconductor substrate or the semiconductor layer that is on a substrate, in some embodiments.

Still referring to FIG. 1A, these embodiments also provide a respective memory cell 30a, 30b on a respective one of the at least two adjacent semiconductor pedestals 10a, 10b having different heights. In some embodiments, these memory cells 30a, 30b may be flash memory cells, such as NAND flash memory cells and may comprise floating gate NAND memory cells and/or charge trap NAND memory cells, as will be described in detail below. However, other memory cells, such as NOR flash memory cells or non-flash memory cells, may also be employed. Moreover, in some embodiments, the different heights of the semiconductor pedestals 10a, 10b are sufficiently different such that a bottom of at least one memory cell 30a is further away from the substrate 10 than a top of at least one memory cell 30b. As used herein, the "bottom" refers to a surface that is closest to the substrate 10.

Finally, still referring to FIG. 1A, the plurality of pedestals may define a plurality of trenches therebetween and an isolation layer 20, such as an oxide isolation layer, may be provided in the plurality of trenches. As shown in FIG. 1, in some embodiments, the isolation layer between at least three adjacent semiconductor pedestals extends a same distance away from the substrate 10.

Figure 1B:
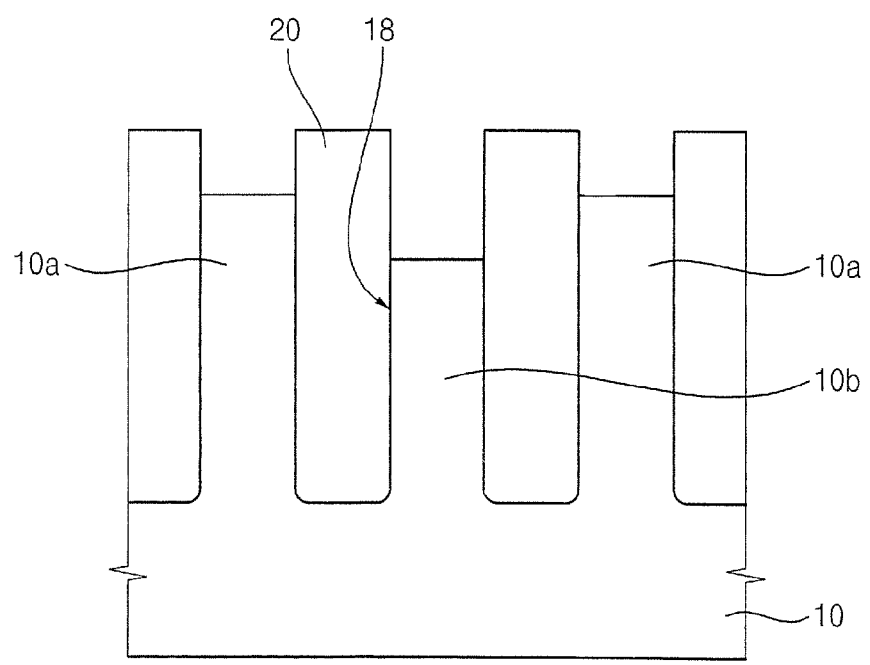
FIG. 1B is a cross-sectional view of embodiments of FIG. 1A during intermediate fabrication steps thereof according to embodiments of the present invention.

FIG. 1B is a cross-sectional view of embodiments of FIG. 1A during intermediate fabrication thereof prior to the formation of the memory cells 30a, 30b. As shown in FIG. 1B, different height pedestals 10a, 10b are formed. The different height pedestals 10a, 10b define trenches 18 therebetween. An isolation layer 20, such as an oxide isolation layer, may be formed in the trenches 18, and, in some embodiments, may fill the trenches 18. The different height pedestals can reduce interference between adjacent memory cells compared to same height pedestals.

Figure 2:
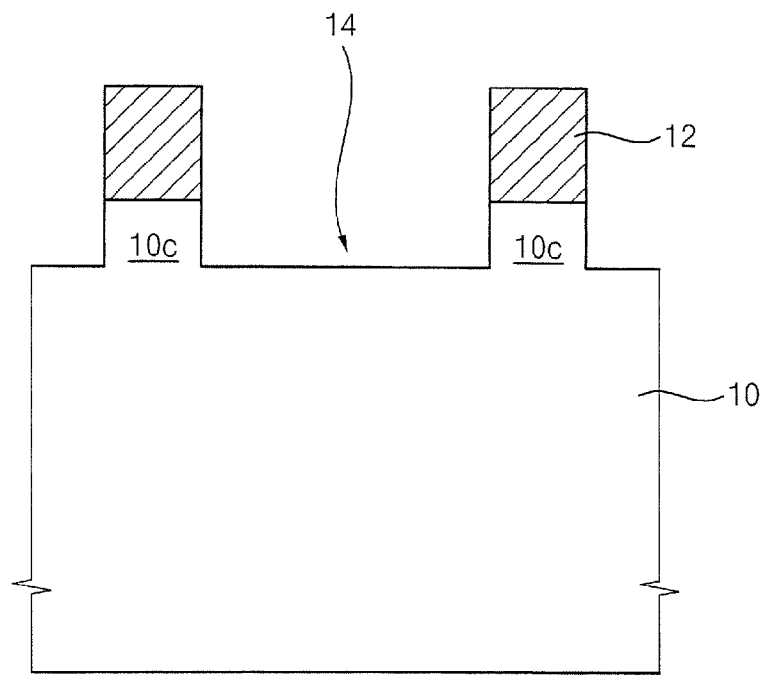
FIGS. 2-4 are cross-sectional views of embodiments of FIG. 1B during intermediate fabrication steps thereof according to various embodiments of the present invention.
Figure 3:
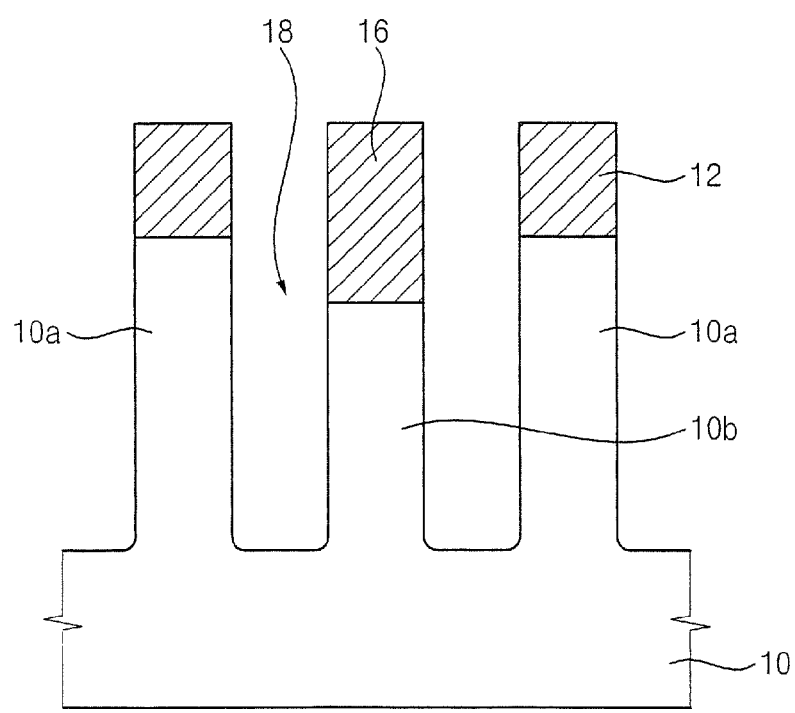
Figure 4:
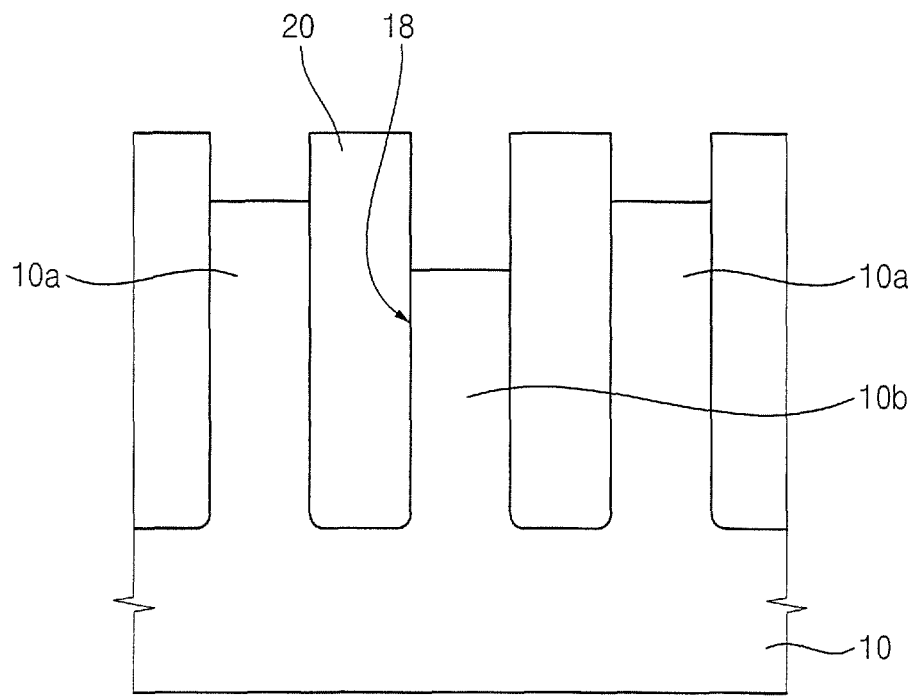

FIG. 2-4 are cross-sectional views of embodiments of FIG. 1B during intermediate fabrication steps thereof, according to various embodiments of the present invention. Referring now to FIG. 2, a first mask pattern 12 is formed on the substrate 10, and first recess area 14 is formed by etching through the first mask pattern 12. The height of the recess 14 may correspond to a desired difference in height between the first and second pedestals and, in some embodiments, may be between about 20 Å and about 2000 Å. The pedestals 10c that are formed in FIG. 2 may be referred to as "precursor pedestals" 10c.

Referring now to FIG. 3, a second mask pattern 16 is formed on the recess area 14 of FIG. 2, and trenches 18 are formed by etching using the first and second mask patterns 12 and 16, respectively, to form pedestals 10a and 10b of different heights. Thus, FIG. 3 illustrates masking portions of the integrated circuit substrate 10 between the precursor pedestals 10c to expose the integrated circuit substrate between the precursor pedestals 10c and the masked portions 16, and etching the integrated circuit substrate between the precursor pedestals 10c and the masked portions 18, to define the plurality of semiconductor pedestals 10a, 10b. As also shown in FIG. 3, in some embodiments, the width of the pedestals 10a, 10b may be identical. However, in other embodiments, different widths may be provided.

Referring now to FIG. 4, an isolation layer, such as an oxide isolation layer 20, is formed, for example, using Chemical Vapor Deposition (CVD) and etch back and/or Chemical Mechanical Polishing (CMP). The first and second mask patterns 12 and 16 are then removed.

Figure 5:
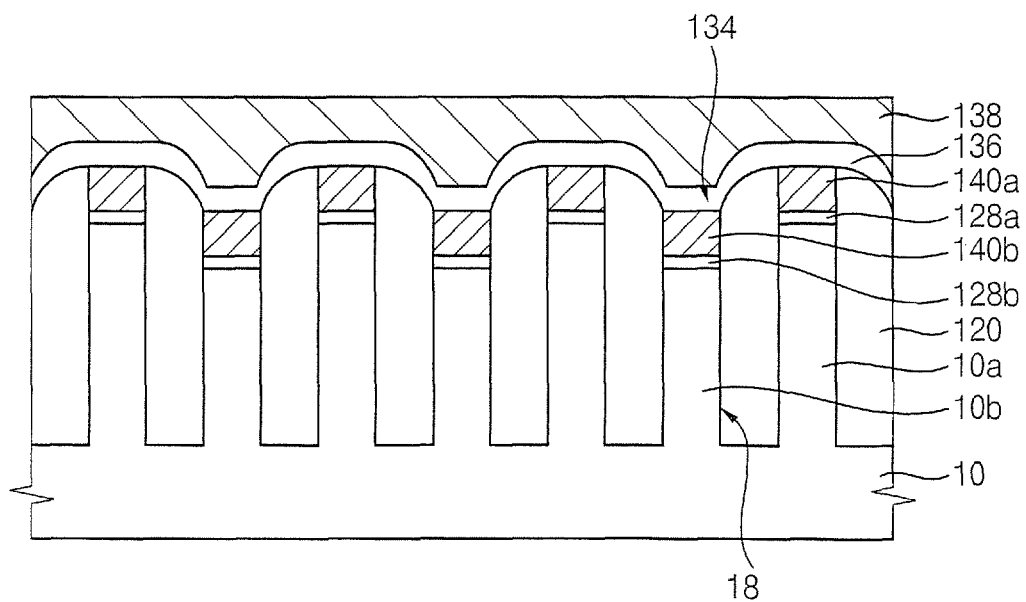
FIG. 5 is a cross-sectional view of a floating gate NAND flash memory device according to various embodiments of the present invention.

Referring now to FIG. 5, a plurality of memory cells are formed on the tops of the semiconductor pedestals 10a, 10b. In FIG. 5, a plurality of floating gate NAND flash memory cells are formed by fabricating a tunnel oxide layer having first tunnel oxide layer portions 128a on the first pedestals 10a and second tunnel oxide portions 128b on the second pedestals 10b. A floating gate layer is then formed on the tunnel oxide layer, to thereby provide first floating gate layer portions 140a on the first tunnel oxide portions 128a, and second floating gate layer portions 140b on the second tunnel oxide portions 128b. A dielectric layer, also referred to as an Inter Poly Dielectric (IPD) layer 136, is then formed on the floating gate portions 140a, 140b, and a control gate 138 is formed on the IPD layer 136. The IPD layer 136 may comprise silicon oxide, silicon nitride and silicon oxide, a stack of silicon oxide, aluminum oxide and silicon oxide, a stack of silicon oxide, hafnium oxide and silicon oxide and/or a stack of silicon oxide, a high dielectric constant material and silicon oxide.

In some embodiments of the present invention, the IPD 136 extends along tops of the floating gates 140a, 140b, but does not extend along sidewalls thereof. However, in other embodiments (not shown in FIG. 5), the IPD 136 extends along tops of the floating gates 140a, 140b, and also extends at least partially along sidewalls thereof. Moreover, as shown in FIG. 5, in some embodiments, the different heights of the pedestals 10a, 10b are sufficiently different, such as a bottom of a first floating gate 140a is further away from the substrate 10 than a top of a second floating gate 140b.

Accordingly, the different height active structures according to some embodiments of the present invention can provide NAND floating gate memory cells having lower interference among adjacent memory cells than same height active structures. Reduced, minimal and/or no interference capacitance may be provided between adjacent floating gates.

Figure 6:
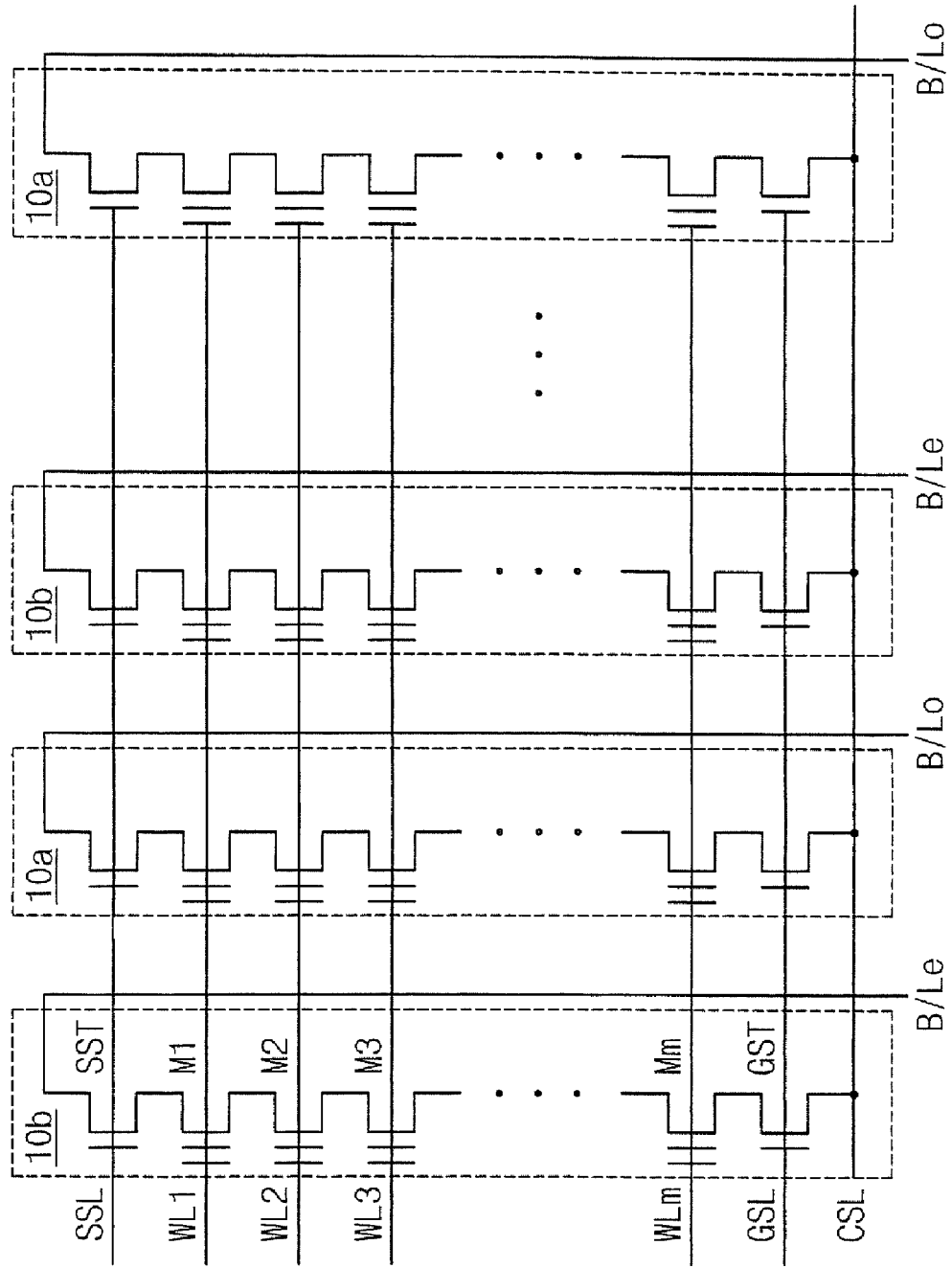
FIG. 6 is a circuit diagram of a NAND flash memory device according to various embodiments of the present invention.

FIG. 6 is a circuit diagram of a NAND flash memory device according to various embodiments of the present invention. As shown in FIG. 6, these NAND flash memory devices include a plurality of odd and even (i.e., alternating) bit lines B/Lo, B/Le, respectively, and a plurality of odd and even strings of flash memory cells MI-Mm, a respective odd and even string being serially connected to a respective odd and even bit line B/Lo, B/Le. A plurality of odd and even semiconductor pedestals 10a, 10b are provided. A respective odd string of flash memory cells is on a respective odd semiconductor pedestal 10a, and a respective even string of flash memory cells is on a respective even semiconductor pedestal 10b, wherein the odd semiconductor pedestals 10a are of different height than the even semiconductor pedestals 10b. In some embodiments, 32 memory cells Mm are provided. Moreover, in some embodiments, each string may also include a string select transistor SST and a ground select transistor GST. A plurality of word lines WL1-WLm, a string select line SSL, a ground select line GSL and a common source line CSL are also provided.

Figure 7:
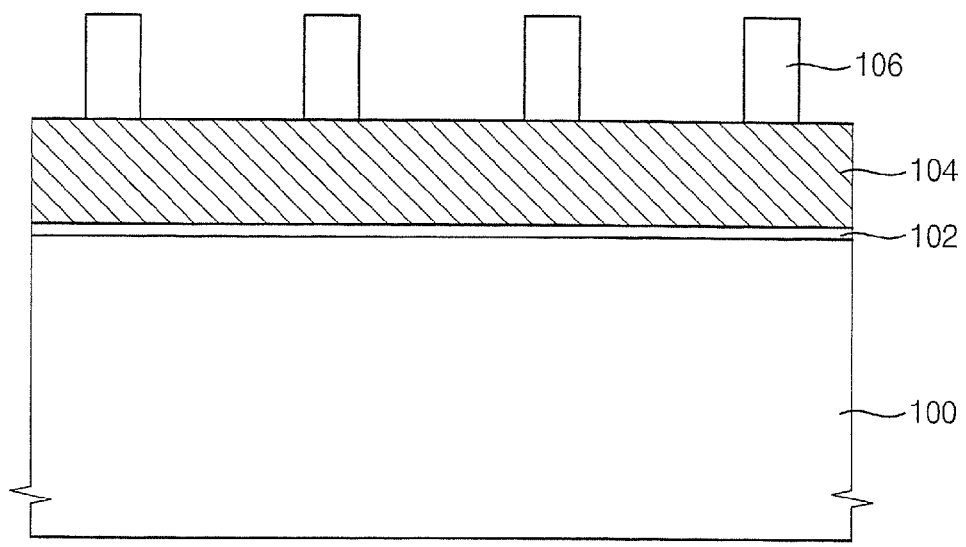
FIGS. 7-20 are cross-sectional views of methods of fabricating integrated circuit memory devices according to various embodiments of the present invention, and devices so fabricated according to various embodiments of the present invention.

FIGS. 7-20 are cross-sectional views of methods of fabricating integrated circuit memory devices and devices so fabricated, according to other embodiments of the present invention. Referring to FIG. 7, a pad oxide 102 is formed on a substrate 100, for example by oxidizing the substrate 100, to about 200 Å in thickness. The substrate 100 may comprise any of the embodiments that were described for substrate 10 of the previous figures. A nitride layer 104 is formed on the pad oxide 102, for example using CVD at a thickness of about 1000 Å. A photoresist pattern 106 is then formed on the nitride layer 104.

Figure 8:
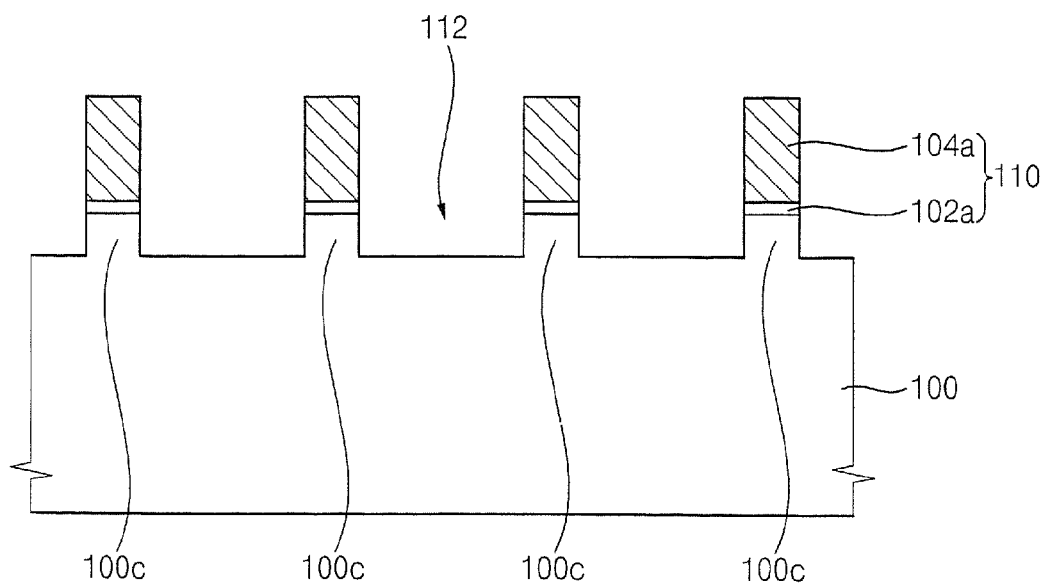

Referring now to FIG. 8, a hard mask 110 is formed by etching the nitride layer 104 and the pad oxide 102 using photoresist 106 as a mask, to provide the hard mask 110 that comprises a patterned nitride layer 104a and a patterned oxide layer 102a. The patterning forms a recessed area 112, the depth of which may define the difference between the first and second pedestal heights. The recessed area may also be viewed as forming spaced apart precursor pedestals 100c beneath the hard mask 110.

Figure 9:
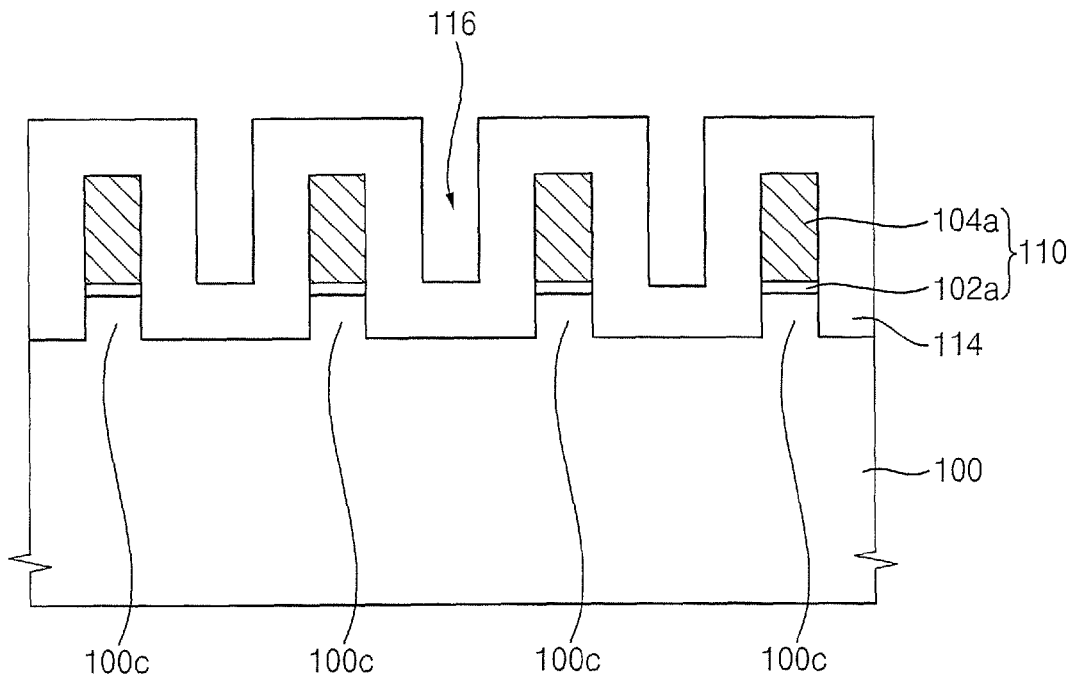

Referring now to FIG. 9, a conformal insulation layer 114 is formed on the first spaced apart precursor pedestals 100c, on the hard mask 110 and on the integrated circuit substrate 100 therebetween. The insulation layer 114 may be formed by CVD process. In some embodiments, the width of the gap 116 may be the same as the width of the first and second active pedestals to be formed.

Figure 10:
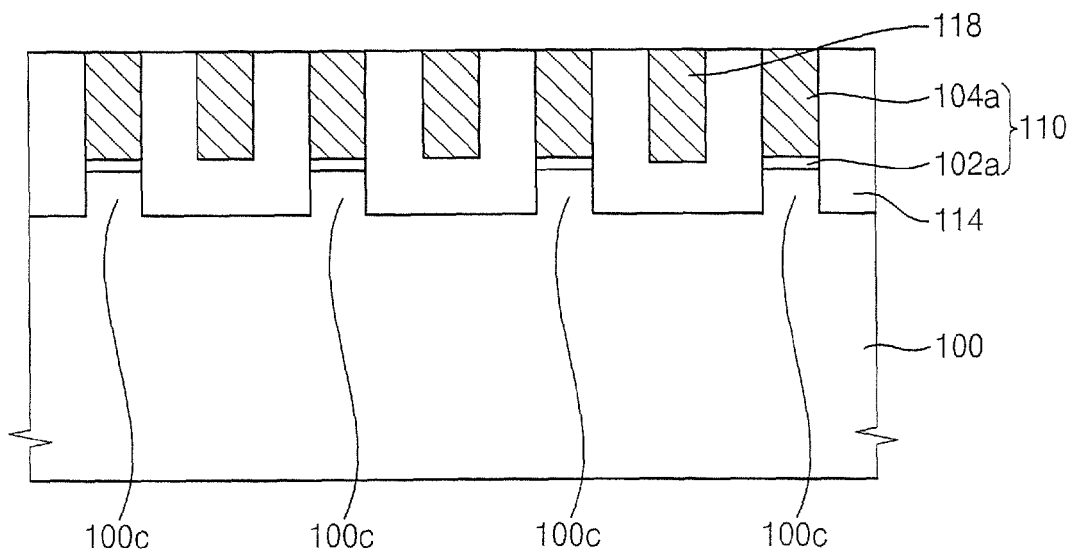
Figure 11:
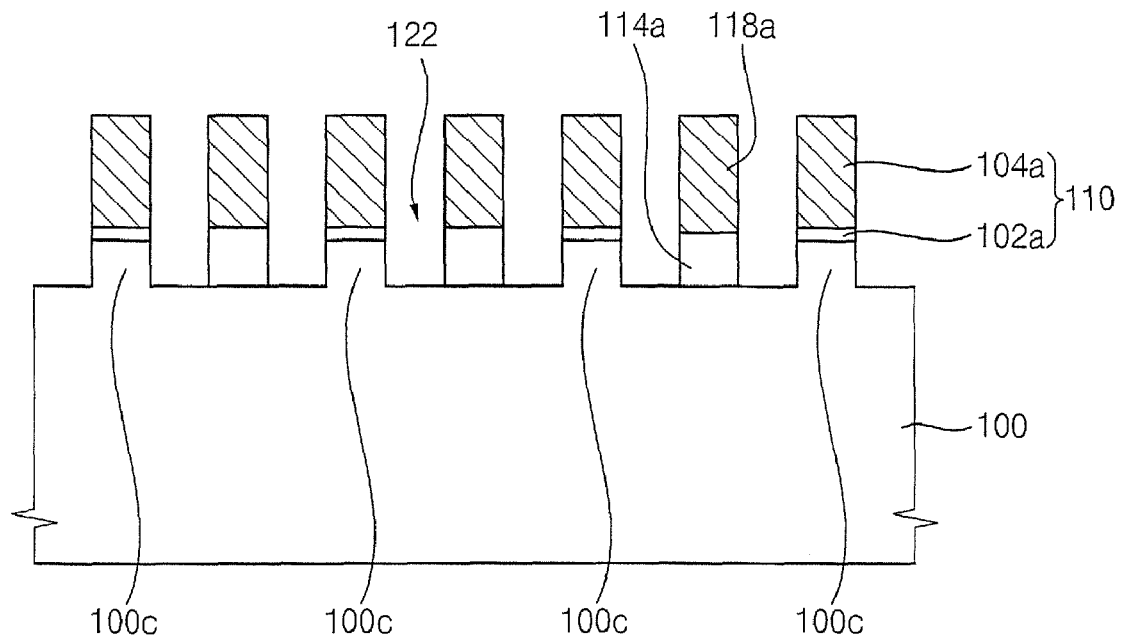

Referring now to FIG. 10, a second insulation layer 118 is formed in the gap 116, for example using CVD, etch back and/or CMP processes. Operations of FIG. 10 may be regarded as forming a masking layer 118 on a portion of the conformal layer 114 that is on the integrated circuit substrate between the spaced apart precursor pedestals 100c.

Figure 12:
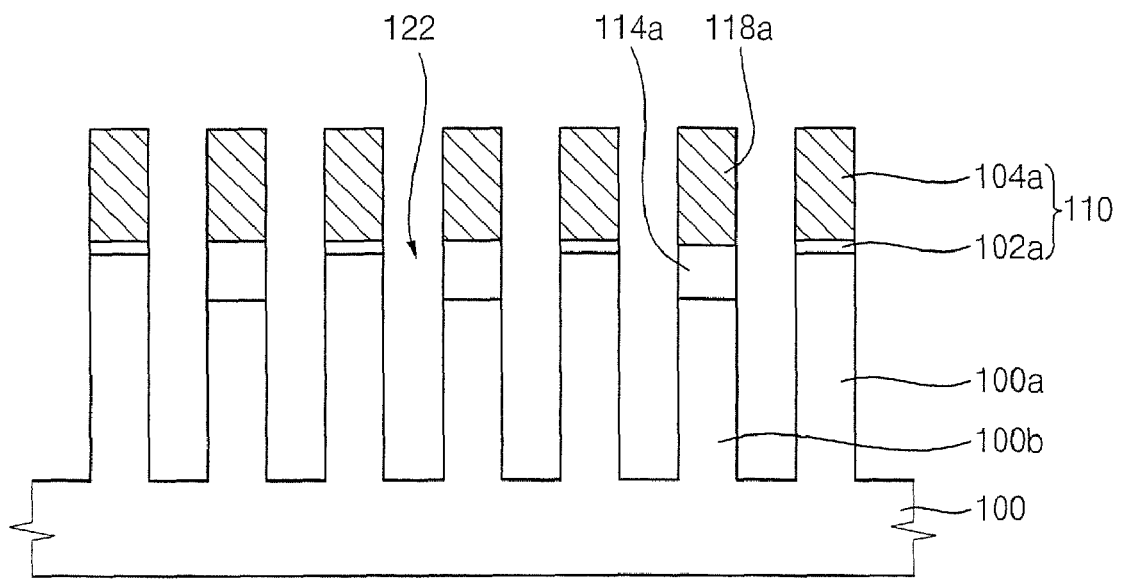

Referring now to FIG. 1, the conformal layer 114 is then removed between the precursor pedestals 100c and the masking layer 118 to expose the integrated circuit substrate and form first trenches 122. Etching of the integrated circuit substrate that is exposed between the precursor pedestals 100c and the masking layer 118 is further performed as shown in FIG. 12, to thereby define the first semiconductor pedestals 100a and the second semiconductor pedestals 100b.

Figure 13:
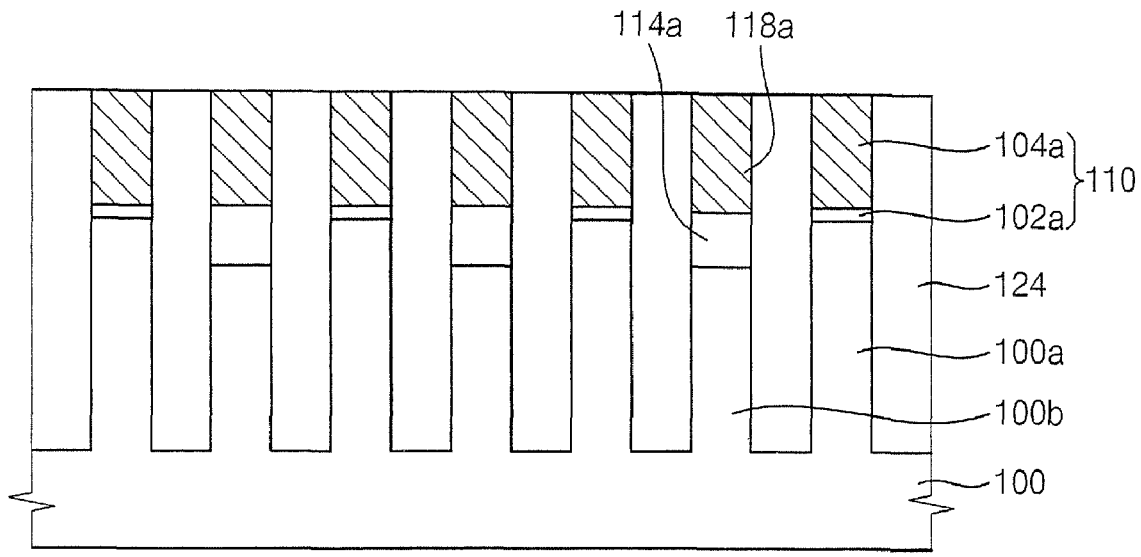
Figure 14:
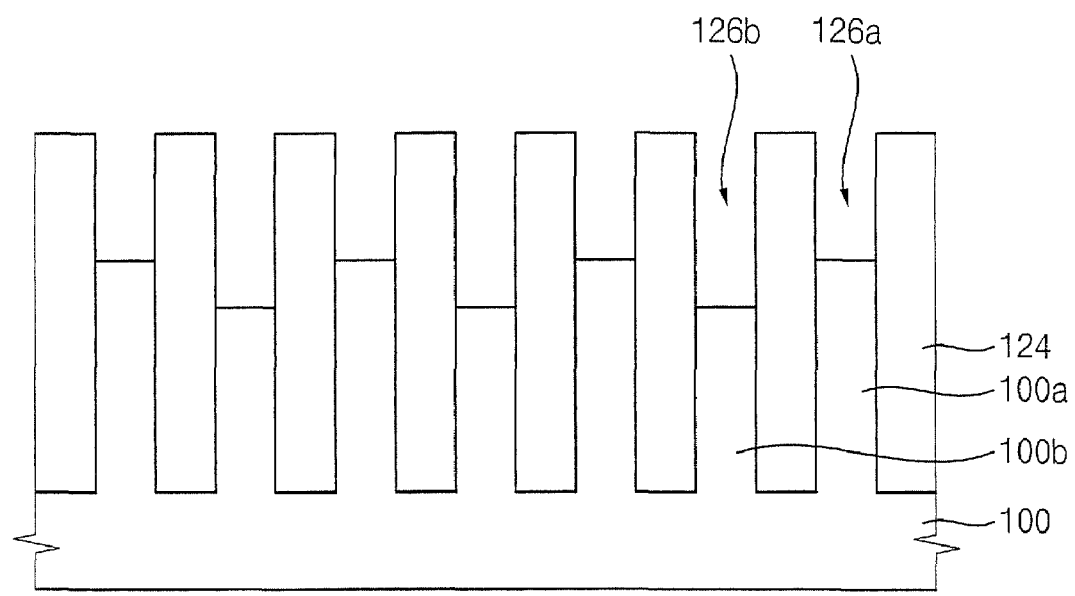

Referring now to FIG. 13, an isolation layer 124 is formed in the second trenches 122, for example using CVD of undoped silicon glass (USG), etch back and/or CMP processes. Then, as shown in FIG. 14, the hard mask 110, the remaining portions 114a of the conformal layer and the remaining portions of the second mask 118a are removed, for example using wet etching. As shown in FIG. 14, a first gap 126a and a second gap 126b are thereby formed on the first and second semiconductor pedestals 100a, 100b, respectively.

Figure 15:
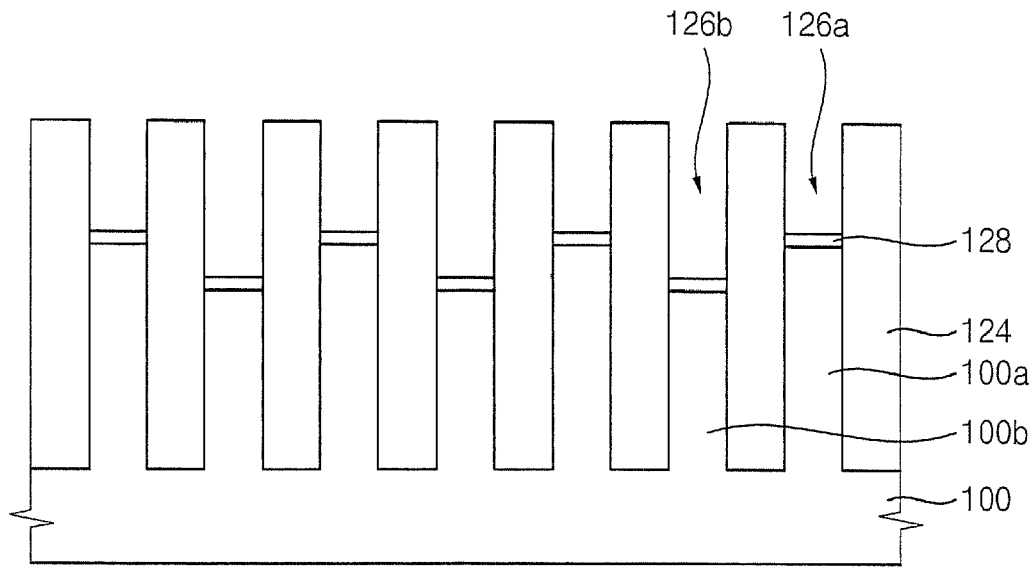
Figure 16:
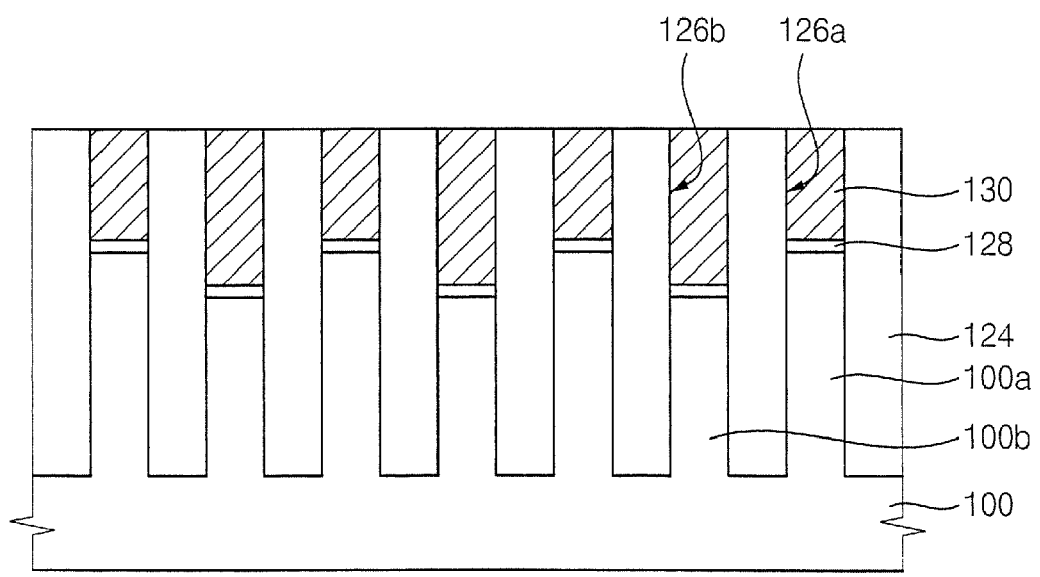
Figure 17:
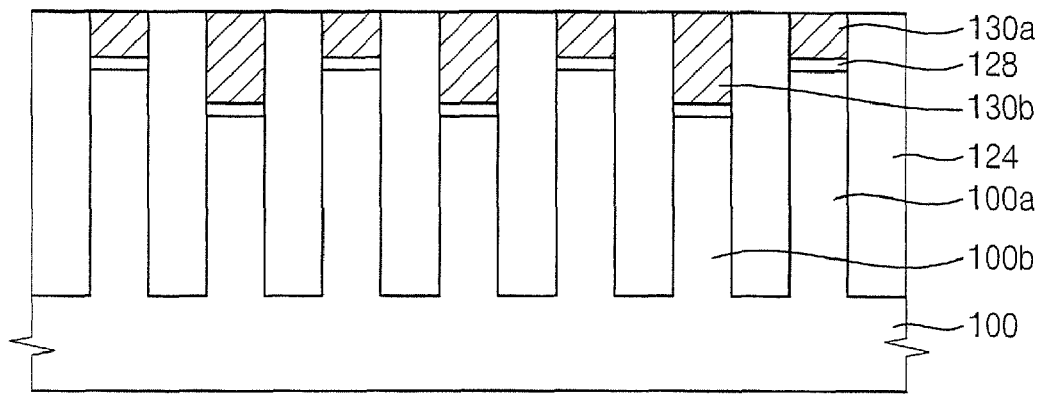
Figure 18:
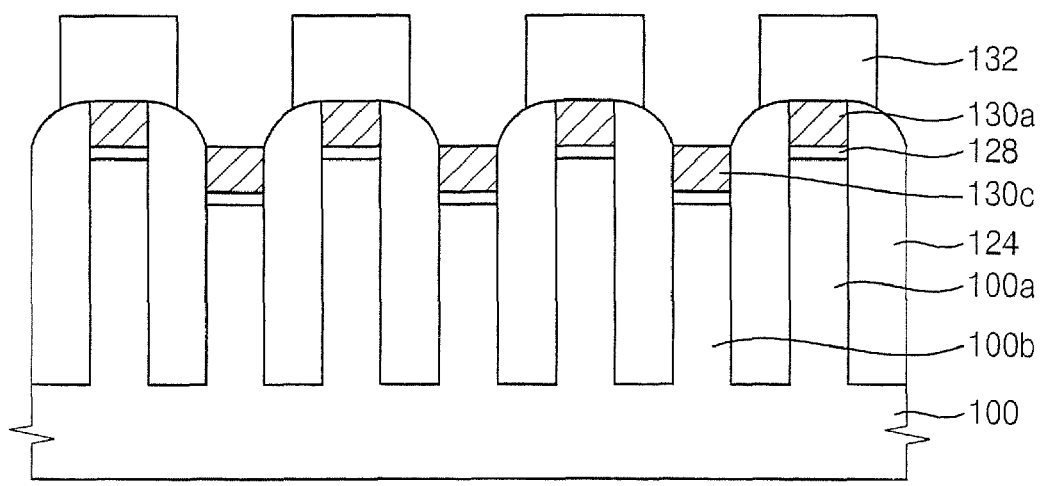

Referring now to FIG. 15, a tunnel oxide layer 128a is formed on the tops of the first and second semiconductor pedestals 110a, 100b, for example by performing oxidation to about 80 Å. Referring to FIG. 16, a floating gate layer 130 is then formed on the tunnel oxide 128, for example using CVD of polysilicon, etch back and/or CMP. Referring now to FIG.

17, CMP is then performed to reduce the heights of the floating gate layer, and thereby form first and second floating gate layer portions 130a, 130b, respectively. Then, referring to FIG. 18, the thickness of the second floating gate layer portion 130b is reduced as shown by 130c, using an etching process that is masked using a second photoresist pattern 132, to achieve the same thickness as the first floating gate layer portion 130a. In other embodiments, different thicknesses may be provided.

Figure 19:
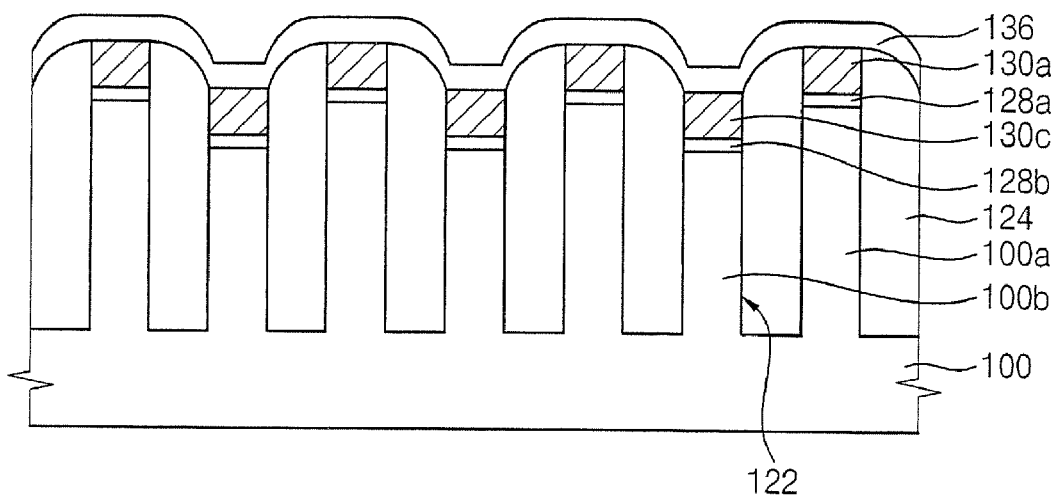
Figure 20:
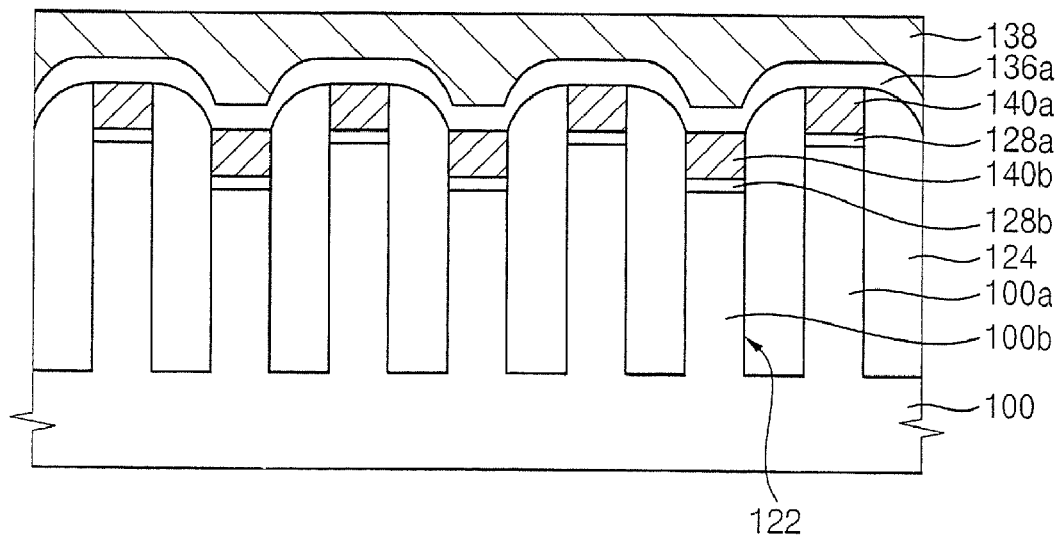

In FIG. 19, the second photoresist pattern 132 is removed, and a dielectric layer, also referred to as an inter poly dielectric layer (IPD) 136, is then formed on the floating gates 130a, for example using CVD to a thickness of about 150 Å. The IPD layer 136 may comprise silicon oxide, silicon nitride and silicon oxide, a stack of silicon oxide, aluminum oxide and silicon oxide, a stack of silicon oxide, hafnium oxide and silicon oxide and/or a stack of silicon oxide, a high dielectric constant material and silicon oxide. Finally, referring to FIG. 20, a control gate 138 is formed using, for example, CVD of polysilicon and/or metal. Accordingly, a floating gate flash memory device may be fabricated.

Figure 21:
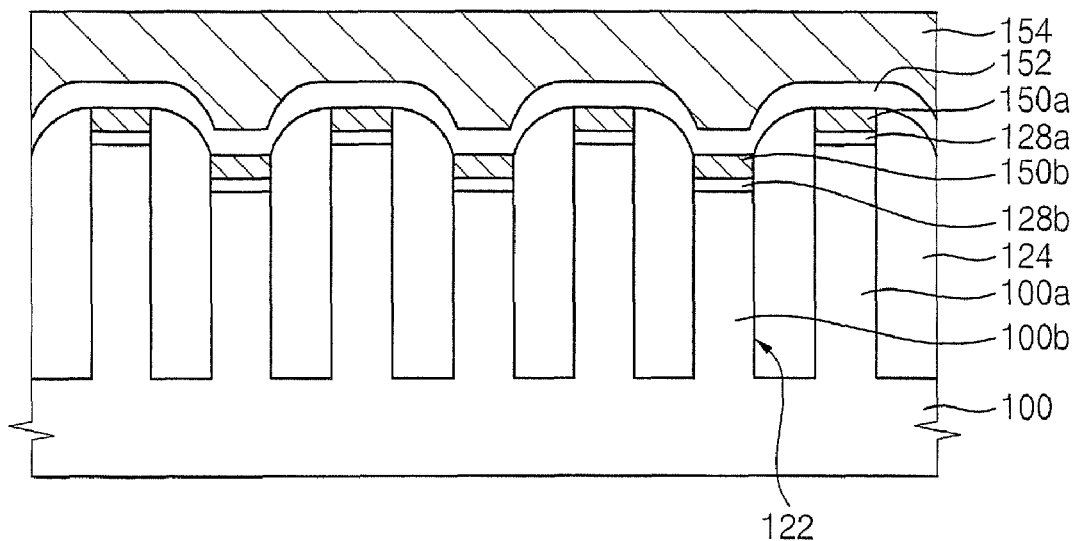
FIG. 21 is a cross-sectional view of a charge trap flash memory device according to embodiments of the present invention.

FIG. 21 illustrates other embodiments of the present invention, wherein a charge trap flash memory device is provided. In contrast with embodiments of FIG. 20, the charge trap flash memory device uses a first charge trap layer 150a and a second charge trap layer 150b on the tunnel oxide layer portions 128a, 128b, respectively. A dielectric layer 152, also referred to as a blocking dielectric layer, 152 is provided on the charge trap layers 150a and 150b, and a gate 154 is provided on the blocking dielectric layer 152. The blocking dielectric layer 152 may comprise one or more of the materials that were already described above in connection with the IPD layer 136. As also shown in FIG. 21, in some embodiments, the bottom of a first charge trap layer 150a is further away from the substrate 100 than a top of a second charge trap layer 150b, to reduce, minimize or eliminate capacitive and/or other coupling between neighboring charge trap flash memory cells.

Figure 22:
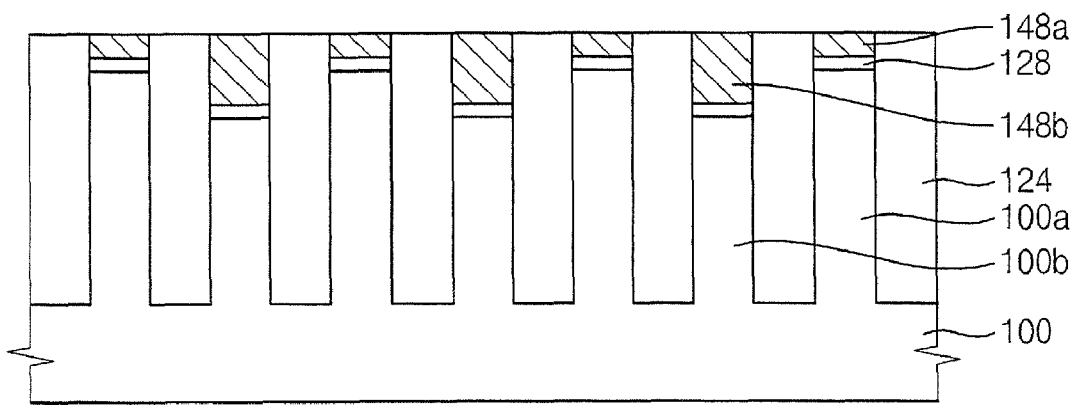
FIGS. 22-24 are cross-sectional views of charge trap flash memory devices according to embodiments of FIG. 21 during intermediate fabrication steps according to various embodiments of the present invention.
Figure 23:
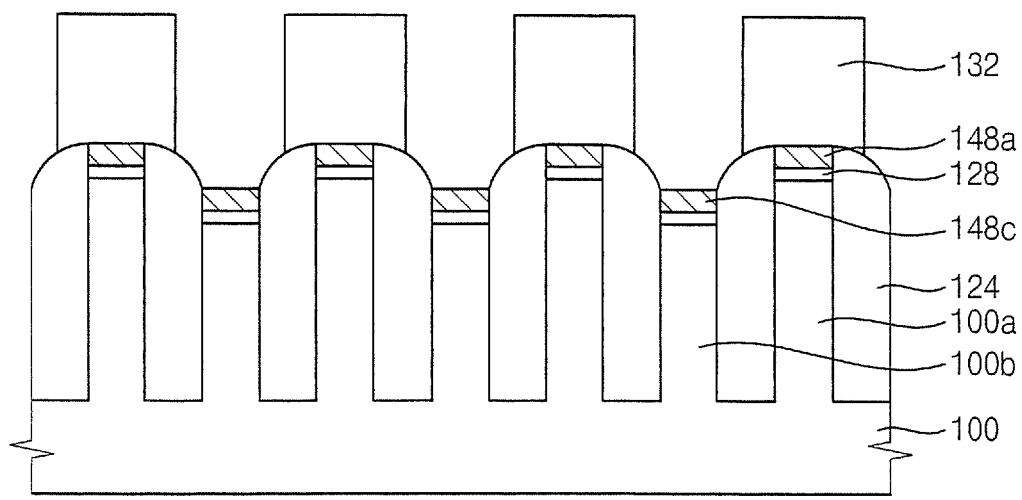
Figure 24:
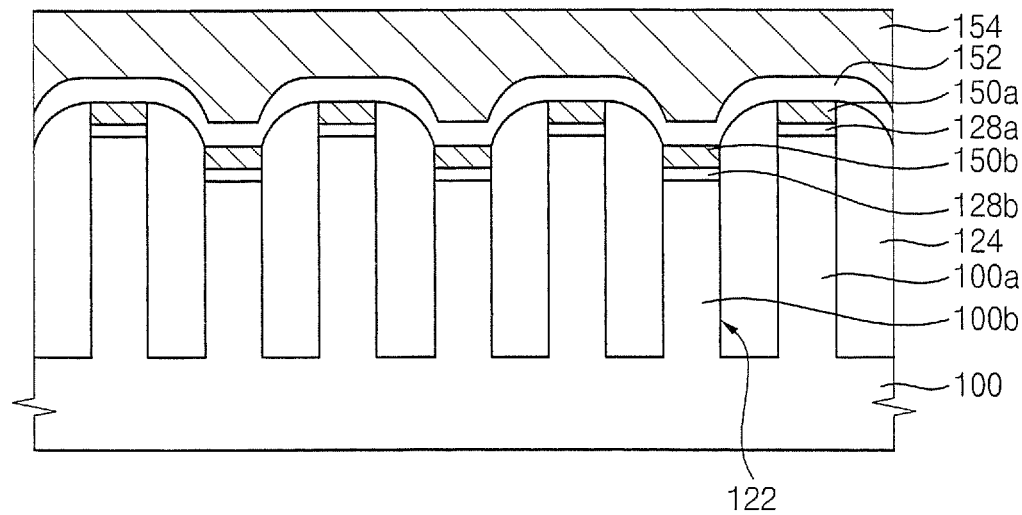

FIGS. 22-24 are cross-sectional views of charge trap flash memory devices according to embodiments of FIG. 21 during intermediate fabrication steps, according to various embodiments of the present invention. Prior to performing the steps of FIG. 22, the fabrication steps of FIGS. 7-15 may be performed. Then, referring to FIG. 22, a charge trap layer including first charge trap layer portions 148a and second charge trap layer portions 148b may be formed on the tunnel oxide layer 128. The charge trap layer may include a nitride layer and/or other conventional charge trap layers. The height of the second charge trap layer may be controlled, as shown in FIG. 23, using a second photoresist pattern 132 and an etch back process to provide second charge trap layers 148c that are the same thickness as the first charge trap layers 148b. In other embodiments, different thicknesses may be provided.

Referring now to FIG. 24, a charge trap layer is formed and etched back to form a first charge trap layer portion 150a on the first pedestals 100a and a second charge trap layer portion 150b on the second pedestals 100b. A dielectric blocking layer 152 is then formed using, for example, any of the materials that were described above in connection with the IPD 136. A gate 154 is then formed on the blocking layer 152.

Figure 25:
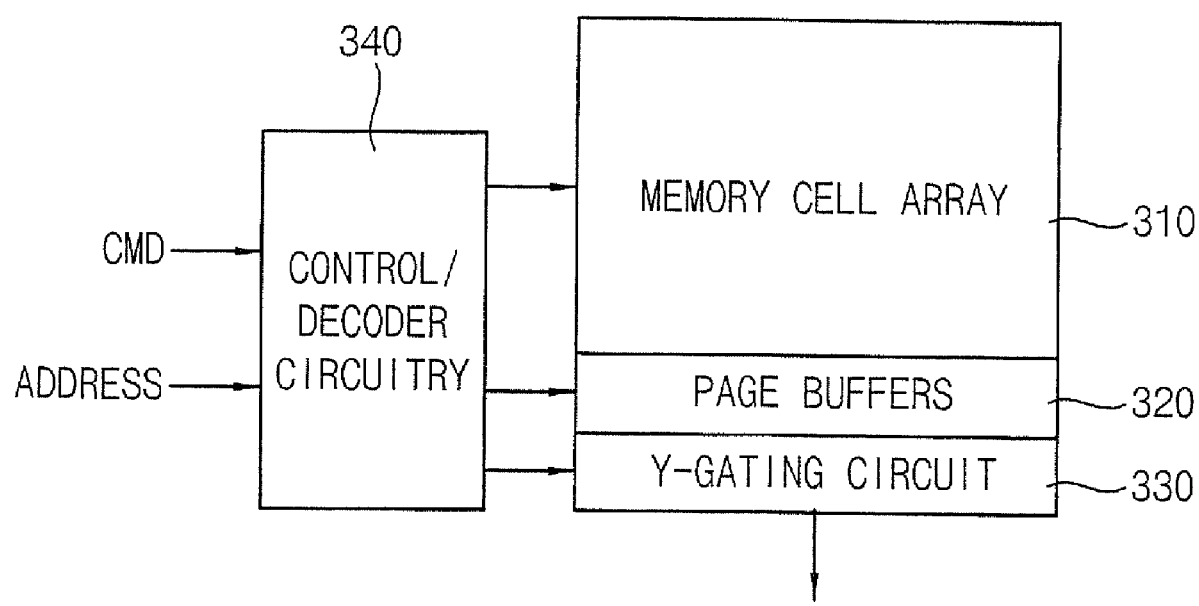
FIG. 25 is an overall block diagram of a NAND flash memory device that includes a memory cell array according to various embodiments of the present invention.

FIG. 25 is an overall block diagram of a NAND flash memory device that includes a memory cell array 310 according to any of the herein described embodiments of the present invention. Page buffers 320 and a Y-gating circuit 330 are provided, as well as a control/decoder circuitry 340 that is responsive to commands CMD and addresses ADDRESS.

Figure 26:
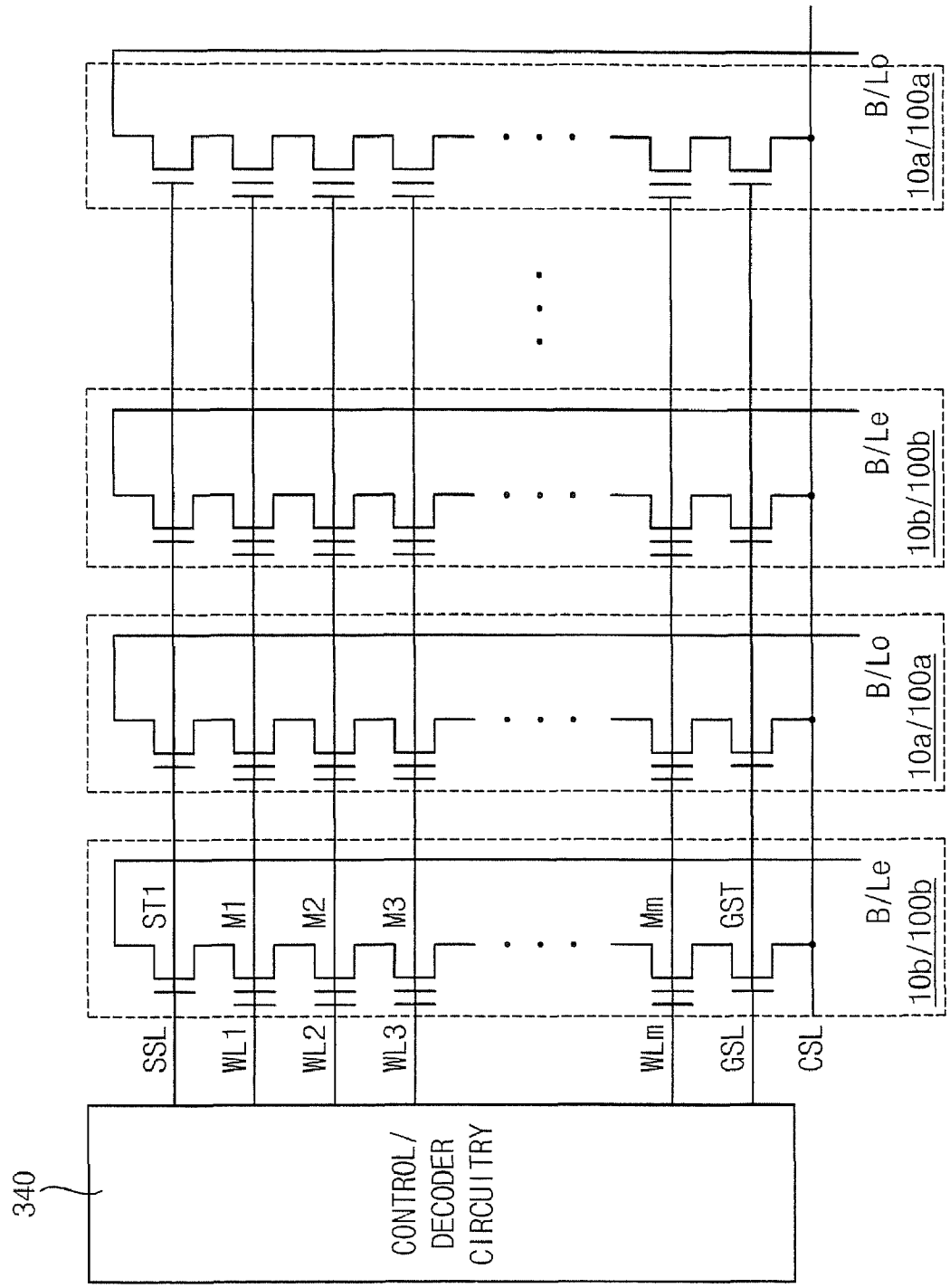
FIG. 26 illustrates a NAND cell array according to various embodiments of the present invention in combination with a control/decoder circuit.

FIG. 26 illustrates a NAND cell array 310 of FIG. 6 and the control/decoder circuit 340 of FIG. 25.

Figure 27:
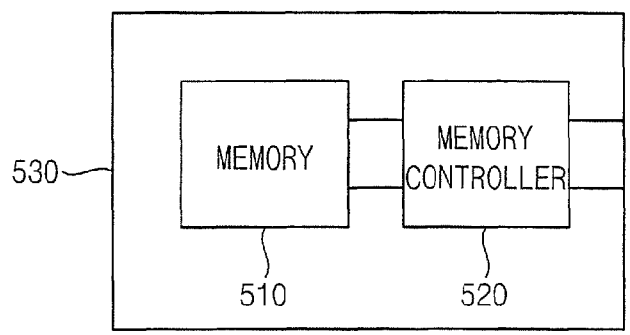
FIGS. 27-36 illustrate memory devices according to various embodiments of the present invention in combination with various host devices.
Figure 28:
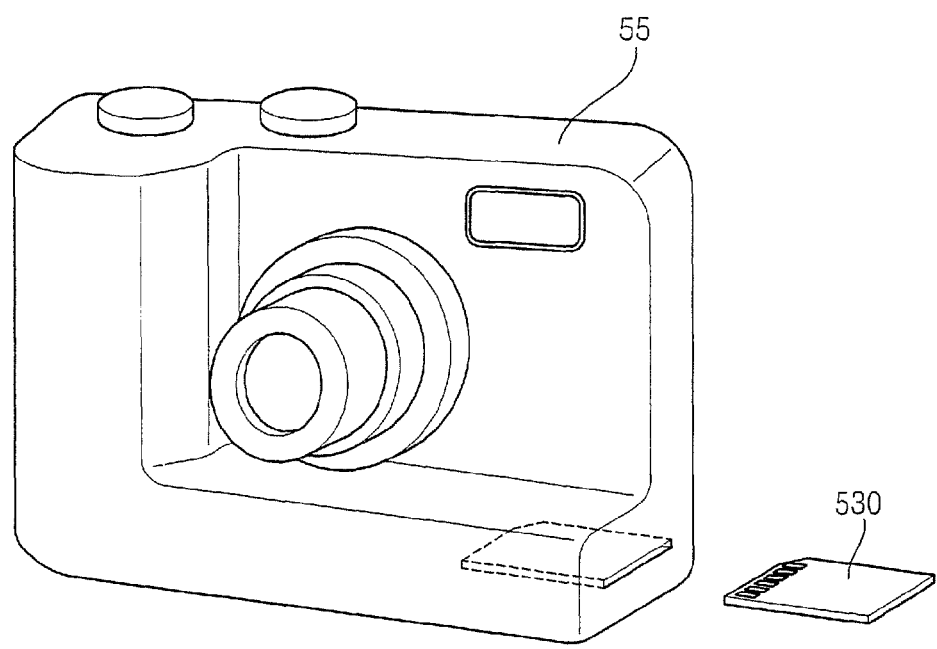
Figure 29:
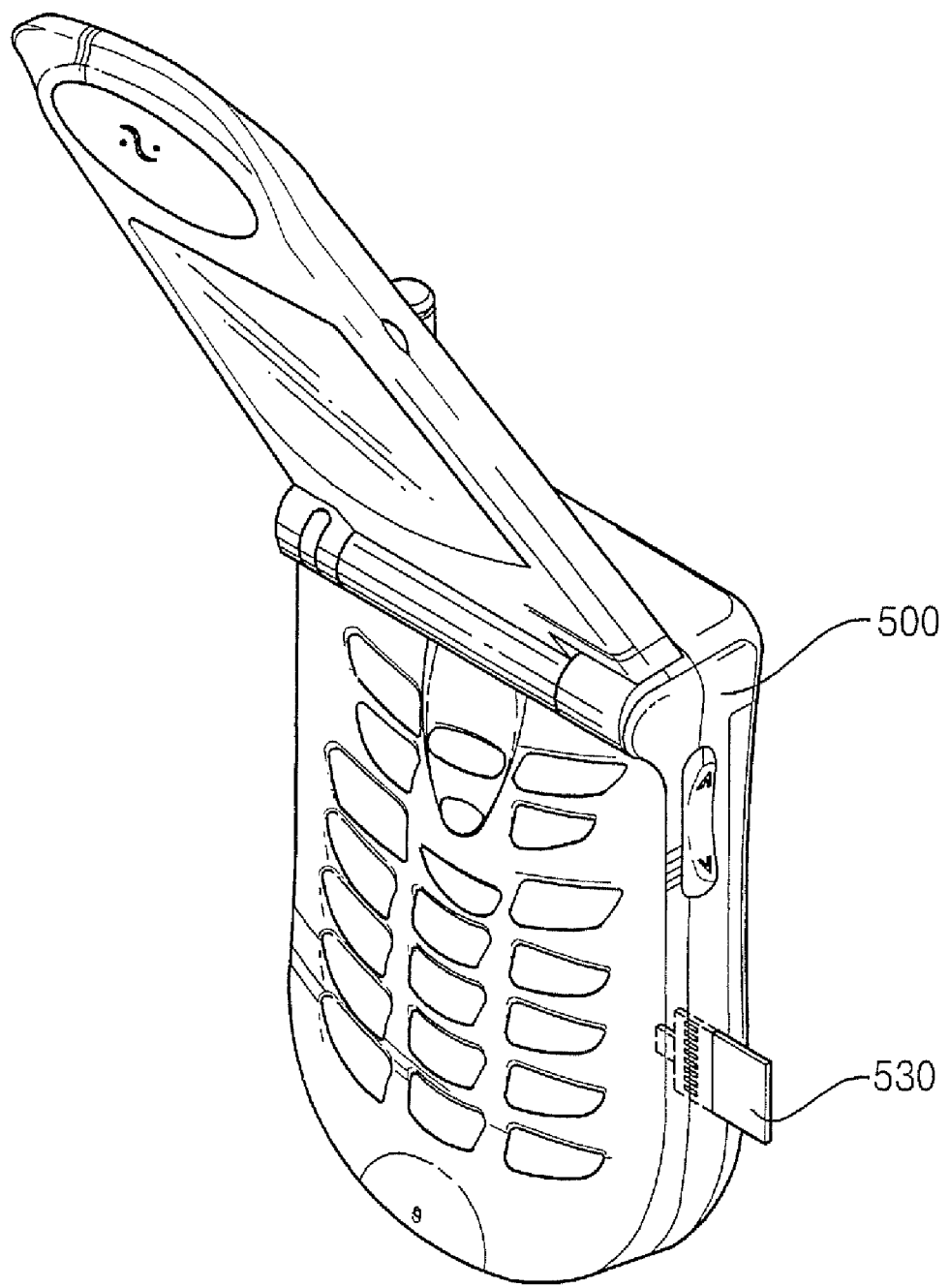
Figure 30:
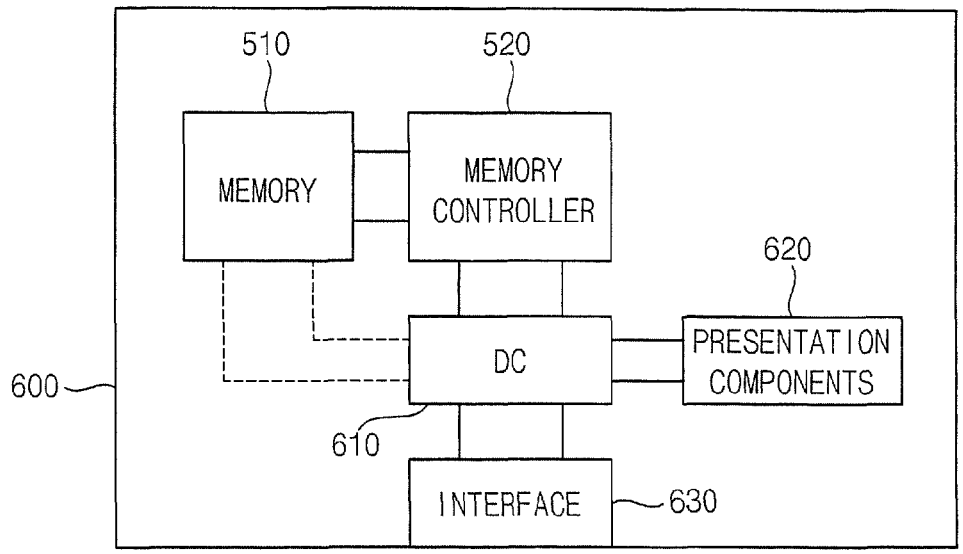
Figure 31:
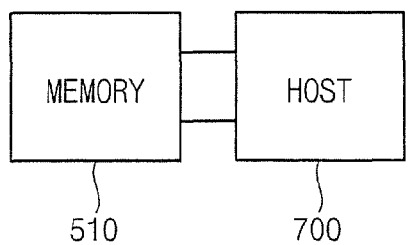
Figure 32:
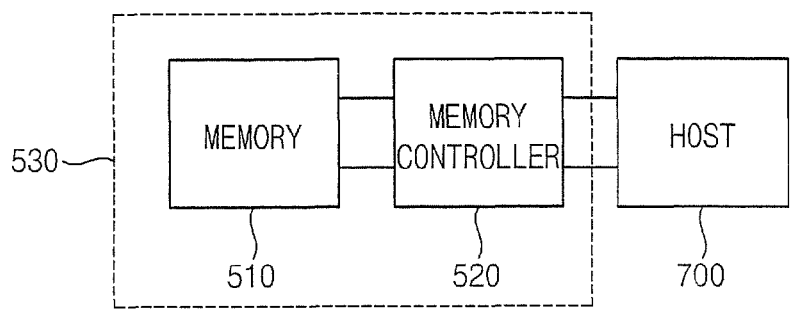
Figure 33:
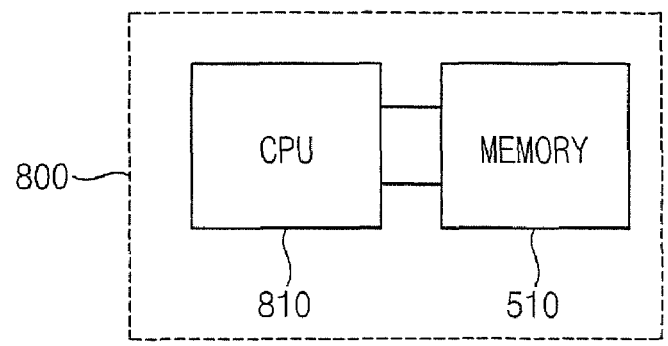
Figure 34:
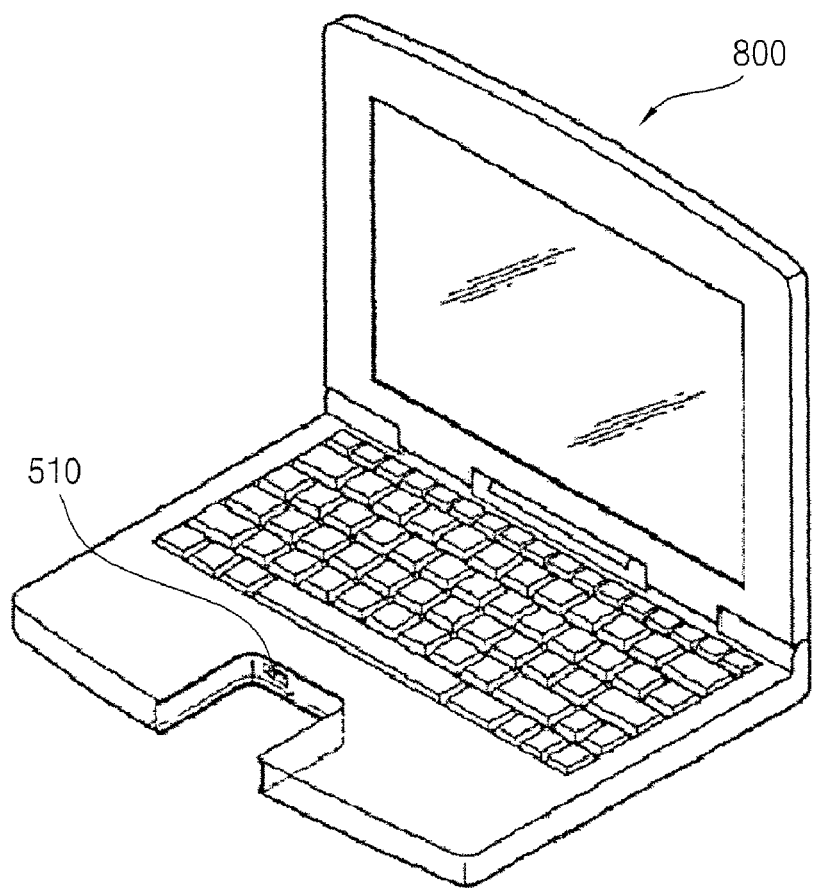
Figure 35:
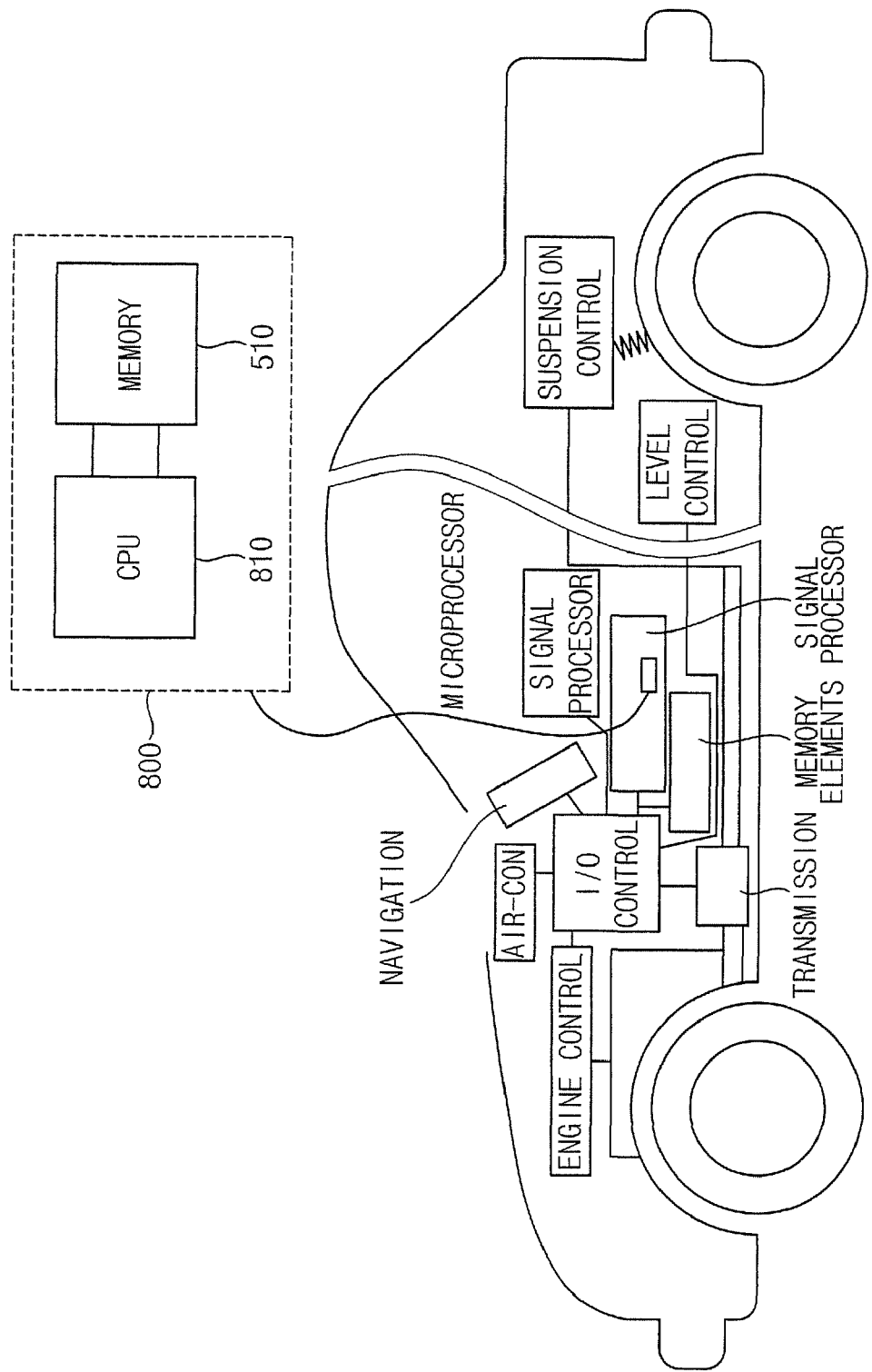
Figure 36:
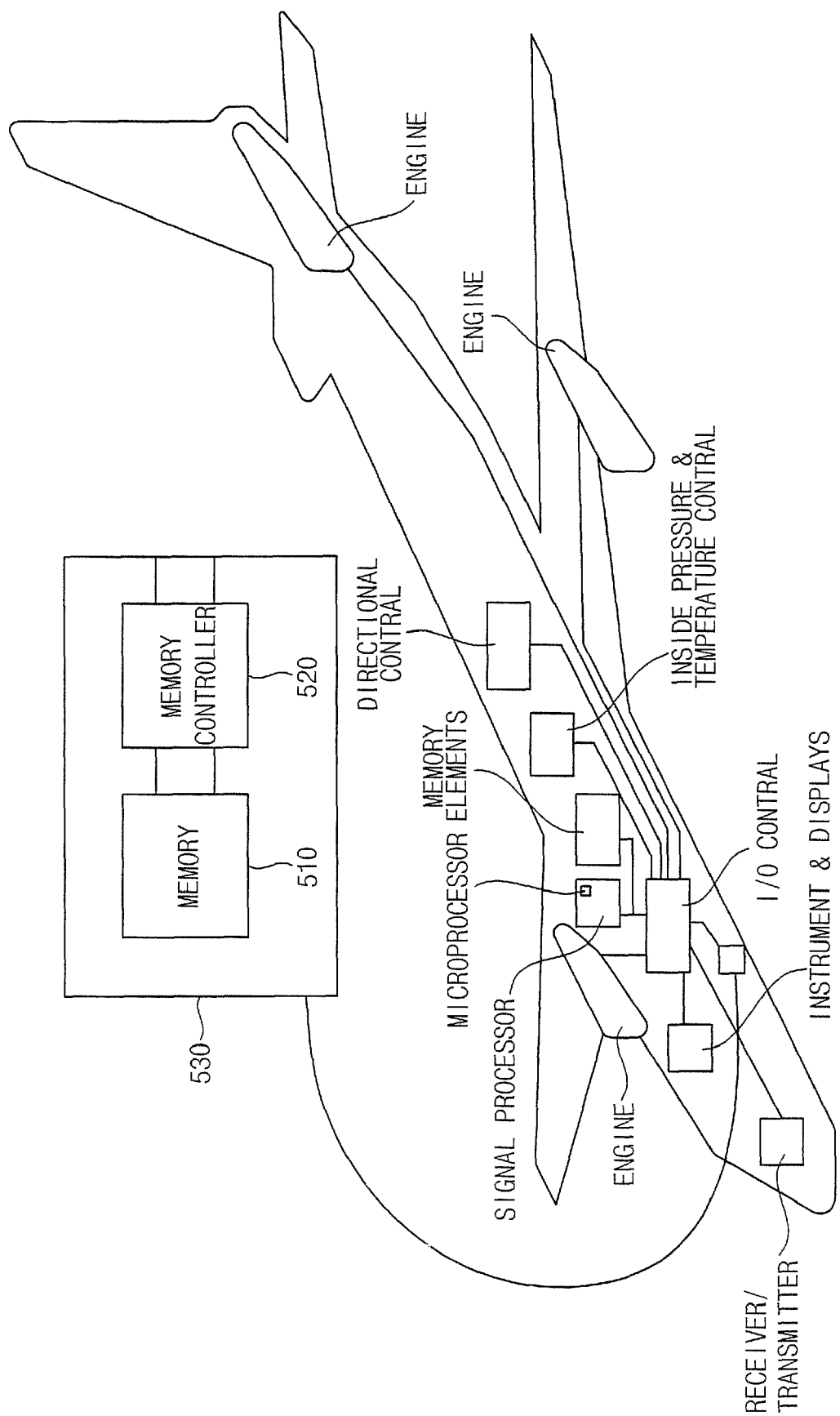

Memory devices according to various embodiments of the present invention may be employed in combination with a host device that is configured to write information into the memory devices and to read information from the memory devices. Thus, for example, FIG. 27 illustrates a memory card 530 that includes a memory controller 520 and a memory 510 according to any embodiments of the present invention. FIG. 28 illustrates the use of a memory card 530 in a digital camera 55. FIG. 29 illustrates the use of a memory card 530 in a wireless terminal, such as a mobile phone 500. FIG. 30 illustrates a memory device 510 according to any embodiments of the present invention in combination with a portable media player 600, such as an MP3 player or other portable player device, and can include a memory controller 520, a device controller 610, an interface 630 and presentation components 620. FIG. 31 illustrates a memory 510 in combination with a general host 700 and FIG. 32 illustrates integration of the memory 510 and a memory controller 520 onto a card 530 and used with a host 700, which can be a personal computer. FIG. 33 illustrates a card 800 that includes a CPU 810 and a memory 510 and that may be included in a notebook computer 800 shown in FIG. 34. The card 800 may be used instead of, or in addition to, hard disk drives. FIG. 35 includes a vehicle 800 that includes a microprocessor 800 having a CPU 810 and memory 510 according to any embodiments of the present invention and that may be used as part of a vehicle navigation system. Finally, FIG. 36 illustrates a memory card 530 including memory 510 according to any embodiments of the present invention and a memory controller 520 that can be used as part of an airplane navigation system.

Accordingly, coupling among adjacent rows/columns of memory cells on an integrated circuit substrate may be reduced or prevented, according to various embodiments of the present invention, by forming the adjacent rows/columns of memory cells on adjacent semiconductor pedestals that extend different distances away from the integrated circuit substrate. Reduced coupling, such as reduced capacitive coupling, may be obtained, due to the height or depth separation among adjacent cells, compared to memory cells that are all formed at a same distance away from the integrated circuit substrate. Adequate separation may be obtained in the vertical/height direction, even when the cells are squeezed together in the horizontal/lateral direction.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An integrated circuit memory device comprising:
   an integrated circuit substrate;
   a plurality of semiconductor pedestals extending away from the substrate, the semiconductor pedestals having semiconductor tops remote from the substrate, at least two adjacent semiconductor pedestals having different heights such that the semiconductor tops of the at least two adjacent semiconductor pedestals are different distances away from the substrate; and
   a respective memory cell on a respective one of the at least two adjacent semiconductor pedestals having different heights.

2. A memory device according to claim 1 wherein the plurality of semiconductor pedestals comprise first and second interleaved arrays of semiconductor pedestals extending away from the substrate, the semiconductor pedestals having semiconductor tops remote from the substrate, the first array having a first height and the second array having a second height that is different from the first height.

3. A memory device according to claim 1 wherein the respective memory cells comprise NAND memory cells.

4. A memory device according to claim 3 wherein the NAND memory cells include a floating gate therein and wherein the different heights are sufficiently different such that a bottom of at least one floating gate is farther away from the substrate than a top of at least one floating gate.

5. A memory device according to claim 1 wherein the plurality of pedestals define a plurality of trenches therebetween, the memory device further comprising an isolation layer in the plurality of trenches.

6. A memory device according to claim 5 wherein the isolation layer between at least three adjacent semiconductor pedestals extends a same distance away from the substrate.

7. A NAND flash memory device comprising:
a plurality of alternating odd and even bit lines;
a plurality of odd and even strings of flash memory cells, a respective odd and even string being serially connected to a respective odd and even bit line; and
a plurality of alternating odd and even semiconductor pedestals, a respective odd string of flash memory cells being on a respective odd semiconductor pedestal and a respective even string of flash memory cells being on a respective even semiconductor pedestal;
wherein the plurality of odd semiconductor pedestals are of different height than the plurality of even semiconductor pedestals.

8. A NAND flash memory device according to claim 7 wherein the flash memory cells are floating gate NAND flash memory cells comprising a tunnel layer on the semiconductor pedestals, a floating gate on the tunnel layer, a dielectric layer on the floating gate and a control gate on the dielectric layer.

9. A NAND flash memory device according to claim 8 wherein the dielectric layer extends along a top of the floating gate but does not extend along sidewalls thereof.

10. A NAND flash memory device according to claim 8 wherein the dielectric layer extends along a top of the floating gate and further extends along sidewalls thereof.

11. A NAND flash memory device according to claim 8 wherein the different heights are sufficiently different such that bottoms of the floating gates in the odd strings are farther away from the substrate than tops of the floating gates in the even strings.

12. A NAND flash memory device according to claim 8 wherein the dielectric layer comprises silicon oxide, silicon nitride, aluminum oxide, hafnium oxide, other high dielectric constant materials, a stack of silicon oxide, silicon nitride and silicon oxide, a stack of silicon oxide, aluminum oxide and silicon oxide, a stack of silicon oxide, hafnium oxide and silicon oxide and/or a stack of silicon oxide, a high dielectric constant material and silicon oxide.

13. A NAND flash memory device according to claim 7 wherein the flash memory cells are charge trap NAND flash memory cells comprising a tunnel layer on the semiconductor pedestals, a charge trap layer on the tunnel layer, a dielectric layer on the charge trap layer and a gate on the dielectric layer.

14. A NAND flash memory device according to claim 13 wherein the dielectric layer extends along a top of the charge trap layer but does not extend along sidewalls thereof.

15. A NAND flash memory device according to claim 13 wherein the dielectric layer extends along a top of the charge trap layer and further extends along sidewalls thereof.

16. A NAND flash memory device according to claim 13 wherein the different heights are sufficiently different such that a bottom of the charge trap layer in the odd strings is farther away from the substrate than a top of the charge trap layer in the even strings.

17. A NAND flash memory device according to claim 13 wherein the dielectric layer comprises silicon oxide, silicon nitride, aluminum oxide, hafnium oxide, other high dielectric constant materials, a stack of silicon oxide, silicon nitride and silicon oxide, a stack of silicon oxide, aluminum oxide and silicon oxide, a stack of silicon oxide, hafnium oxide and silicon oxide and/or a stack of silicon oxide, a high dielectric constant material and silicon oxide.

18. A NAND flash memory device according to claim 7 in combination with a host device that is configured to write information into the NAND flash memory device and to read information from the NAND flash memory device.

19. A NAND flash memory device according to claim 18 wherein the host device comprises a memory controller, a microprocessor, a camera, a wireless terminal, a portable media player, a desktop computer, a notebook computer and/or a vehicle navigation system.

20. A method of fabricating an integrated circuit memory device comprising:
forming a plurality of semiconductor pedestals that extend away from an integrated circuit substrate, the semiconductor pedestals having semiconductor tops remote from the substrate, at least two adjacent semiconductor pedestals having different heights such that the semiconductor tops of the at least two adjacent semiconductor pedestals are different distances away from the substrate; and
forming a respective memory cell on a respective one of the at least two adjacent semiconductor pedestals having different heights.

21. A method according to claim 20 wherein forming a plurality of semiconductor pedestals comprises:
forming spaced apart precursor pedestals in the integrated circuit substrate;
masking portions of the integrated circuit substrate between the precursor pedestals to expose the integrated circuit substrate between the precursor pedestals and the masked portions; and
etching the integrated circuit substrate between the precursor pedestals and the masked portions to define the plurality of semiconductor pedestals.

22. A method according to claim 21 further comprising:
forming an isolation layer between the plurality of semiconductor pedestals.

23. A method according to claim 20 wherein forming a plurality of semiconductor pedestals comprises:
forming spaced apart precursor pedestals in the integrated circuit substrate;
forming a conformal layer on the spaced apart precursor pedestals and on the integrated circuit substrate therebetween;
forming a masking layer on a portion of the conformal layer that is on the integrated circuit substrate between the spaced apart precursor pedestals;
removing the conformal layer between the precursor pedestals and the masking layer to expose the integrated circuit substrate; and
etching the integrated circuit substrate that is exposed between the precursor pedestals and the masking layer to define the plurality of semiconductor pedestals.

24. A method according to claim 23 further comprising:
forming an isolation layer between the plurality of semiconductor pedestals.

25. A method according to claim 20 wherein forming a respective memory cell comprises:
    forming a tunnel layer on the semiconductor pedestals;
    forming a floating gate on the tunnel layer;
    forming a dielectric layer on the floating gate; and
    forming a control gate on the dielectric layer to thereby form a floating gate flash memory device.

26. A method according to claim 25 wherein forming a dielectric layer comprises forming a dielectric layer along a top of the floating gate but not extending along sidewalls thereof.

27. A method according to claim 25 wherein forming a dielectric layer comprises forming a dielectric layer along a top of the floating gate and further extending along sidewalls thereof.

28. A method according to claim 25 wherein the dielectric layer comprises silicon oxide, silicon nitride, aluminum oxide, hafnium oxide, other high dielectric constant materials, a stack of silicon oxide, silicon nitride and silicon oxide, a stack of silicon oxide, aluminum oxide and silicon oxide, a stack of silicon oxide, hafnium oxide and silicon oxide and/or a stack of silicon oxide, a high dielectric constant material and silicon oxide.

29. A method according to claim 20 wherein forming a respective memory cell comprises:
    forming a tunnel layer on the semiconductor pedestals;
    forming a charge trap layer on the tunnel layer;
    forming a dielectric layer on the charge trap layer; and
    forming a gate on the dielectric layer to thereby form a charge trap flash memory device.

30. A method according to claim 29 wherein forming a dielectric layer comprises forming a dielectric layer along a top of the charge trap layer but not extending along sidewalls thereof.

31. A method according to claim 29 wherein forming a dielectric layer comprises forming a dielectric layer along a top of the charge trap layer and further extending along sidewalls thereof.

32. A method according to claim 29 wherein the dielectric layer comprises silicon oxide, silicon nitride, aluminum oxide, hafnium oxide, other high dielectric constant materials, a stack of silicon oxide, silicon nitride and silicon oxide, a stack of silicon oxide, aluminum oxide and silicon oxide, a stack of silicon oxide, hafnium oxide and silicon oxide and/or a stack of silicon oxide, a high dielectric constant material and silicon oxide.

* * * * *